US012733457B2

(12) United States Patent
Berglund et al.

(10) Patent No.: US 12,733,457 B2
(45) Date of Patent: Sep. 8, 2026

(54) SYSTEMS AND METHODS THAT USE INFRARED (IR) SPECTROSCOPY TO MONITOR PROCESS CHEMICALS UTILIZED IN A SEMICONDUCTOR PROCESS

(71) Applicant: Tokyo Electron Limited, Tokyo (JP)

(72) Inventors: Sean Berglund, Austin, TX (US); Michael Carcasi, Austin, TX (US); Robert Brandt, Albany, NY (US); Joshua Hooge, Austin, TX (US); Ankur Agarwal, Austin, TX (US); Ryan Burns, Austin, TX (US)

(73) Assignee: Tokyo Electron Limited, Tokyo (JP)

( * ) Notice: Subject to any disclaimer, the term of this patent is extended or adjusted under 35 U.S.C. 154(b) by 391 days.

(21) Appl. No.: 18/373,582

(22) Filed: Sep. 27, 2023

(65) Prior Publication Data

US 2025/0105066 A1 Mar. 27, 2025

(51) Int. Cl.

| | |
|---|---|
| ***H10P 74/00*** | (2026.01) |
| ***G03F 7/00*** | (2006.01) |
| ***H10P 72/00*** | (2026.01) |
| *G03F 7/004* | (2006.01) |

(52) U.S. Cl.

CPC ........ *H10P 74/238* (2026.01); *G03F 7/70533* (2013.01); *H10P 72/0604* (2026.01); *G03F 7/0042* (2013.01)

(58) Field of Classification Search

None

See application file for complete search history.

(56) References Cited

U.S. PATENT DOCUMENTS

| | | | |
|---|---|---|---|
| 4,782,232 | A | 11/1988 | Bernstein et al. |
| RE33,789 | E | 1/1992 | Stevenson |
| 5,534,066 | A | 7/1996 | O'Neill et al. |
| 5,545,897 | A | 8/1996 | Jack |
| 5,922,609 | A | 7/1999 | Kellner et al. |

(Continued)

FOREIGN PATENT DOCUMENTS

| | | |
|---|---|---|
| CN | 111855605 | 10/2020 |
| JP | H07111232 | 4/1995 |

(Continued)

OTHER PUBLICATIONS

Horiba Advanced Techno. Co., Ltd, "Chemical Concentration Monitor For Semiconductor Manufacturing Equipment Launched", Dec. 2019, 2 pgs.

(Continued)

*Primary Examiner* — Anthony Ho

(74) *Attorney, Agent, or Firm* — Egan, Enders & Huston LLP.

(57) ABSTRACT

Various embodiments of improved systems and methods are provided herein to monitor process chemicals used in a semiconductor process. More specifically, new semiconductor processing systems and methods that utilize infrared (IR) spectroscopy techniques are provided herein to monitor the composition and/or concentration of process chemicals utilized to process a substrate and/or the by-products produced during substrate processing. By monitoring the process chemicals and/or the by-products in real-time, the systems and methods described herein can be used to provide better process control and/or end-point detection for a wide variety of semiconductor processes.

21 Claims, 10 Drawing Sheets

(56) References Cited

U.S. PATENT DOCUMENTS

| | | | |
|---|---|---|---|
| 7,102,132 | B2 | 9/2006 | Ludviksson |
| 9,897,584 | B2 | 2/2018 | Islam |
| 2002/0053640 | A1 | 5/2002 | Kester et al. |
| 2003/0121799 | A1 | 7/2003 | Stevens et al. |
| 2005/0202564 | A1 | 9/2005 | Lee et al. |
| 2021/0285822 | A1 | 9/2021 | Carcasi et al. |

FOREIGN PATENT DOCUMENTS

| | | |
|---|---|---|
| JP | 2017508136 | 3/2017 |
| KR | 20000021787 | 4/2000 |
| KR | 20100073562 | 7/2010 |

OTHER PUBLICATIONS

Horiba Semiconductor, "Fiber Optic Type Chemical Solution Concentration Monitor", HAE-T0281Aa, Obtained from Internet as early as Aug. 22, 2023, 4 pgs.

Horiba Semiconductor, "Non Contact Chemical Concentration Monitor CS-900", HAE-T0113E, Obtained from Internet as early as Aug. 22, 2023, 4 pgs.

Romer, "Investigating Physical Properties of Solid Dosage Forms During Pharmaceutical Processing", Aug. 2008, 57 pgs.

The International Search Report and the Written Opinion; PCT/US2024/038378; Oct. 28, 2024, 10 pgs.

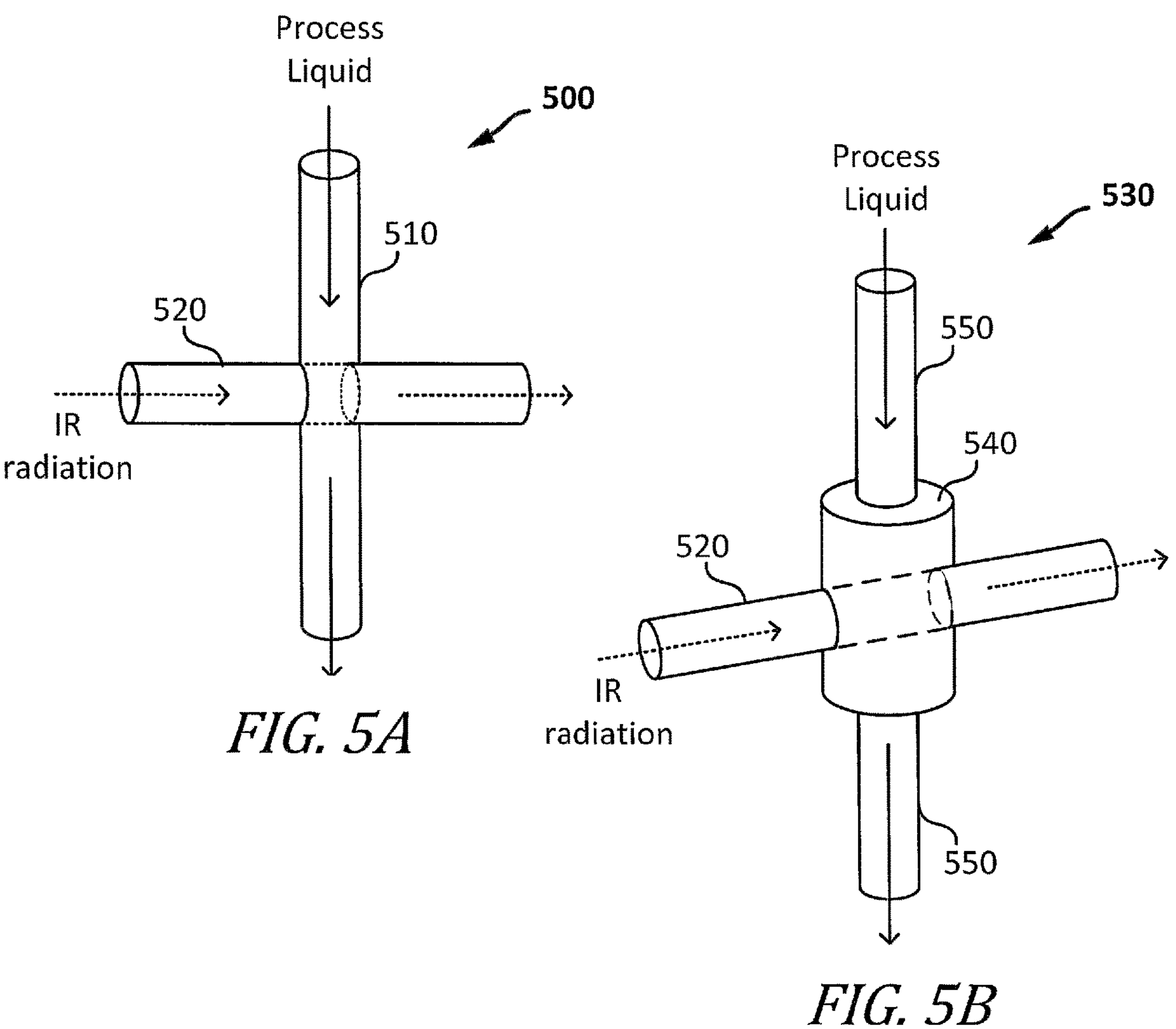
FIG. 5A
FIG. 5B
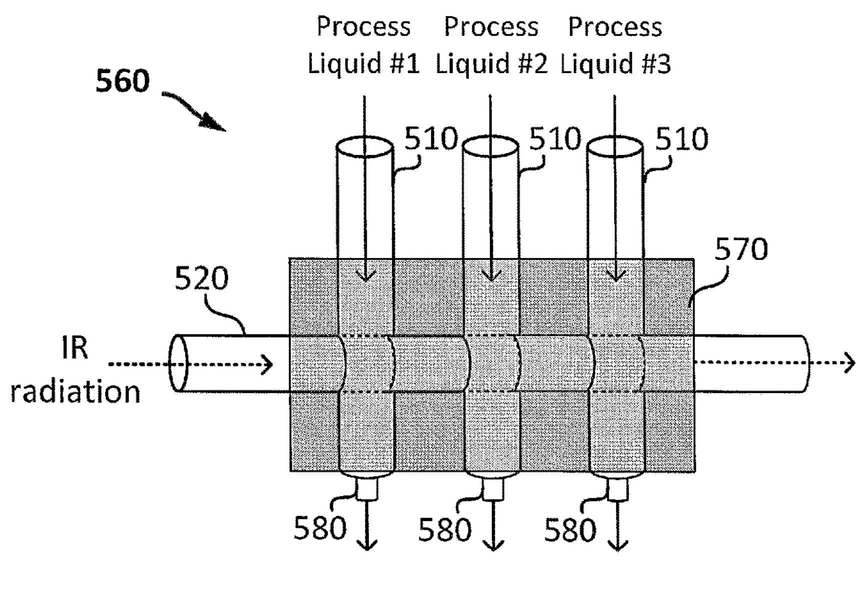
FIG. 5C

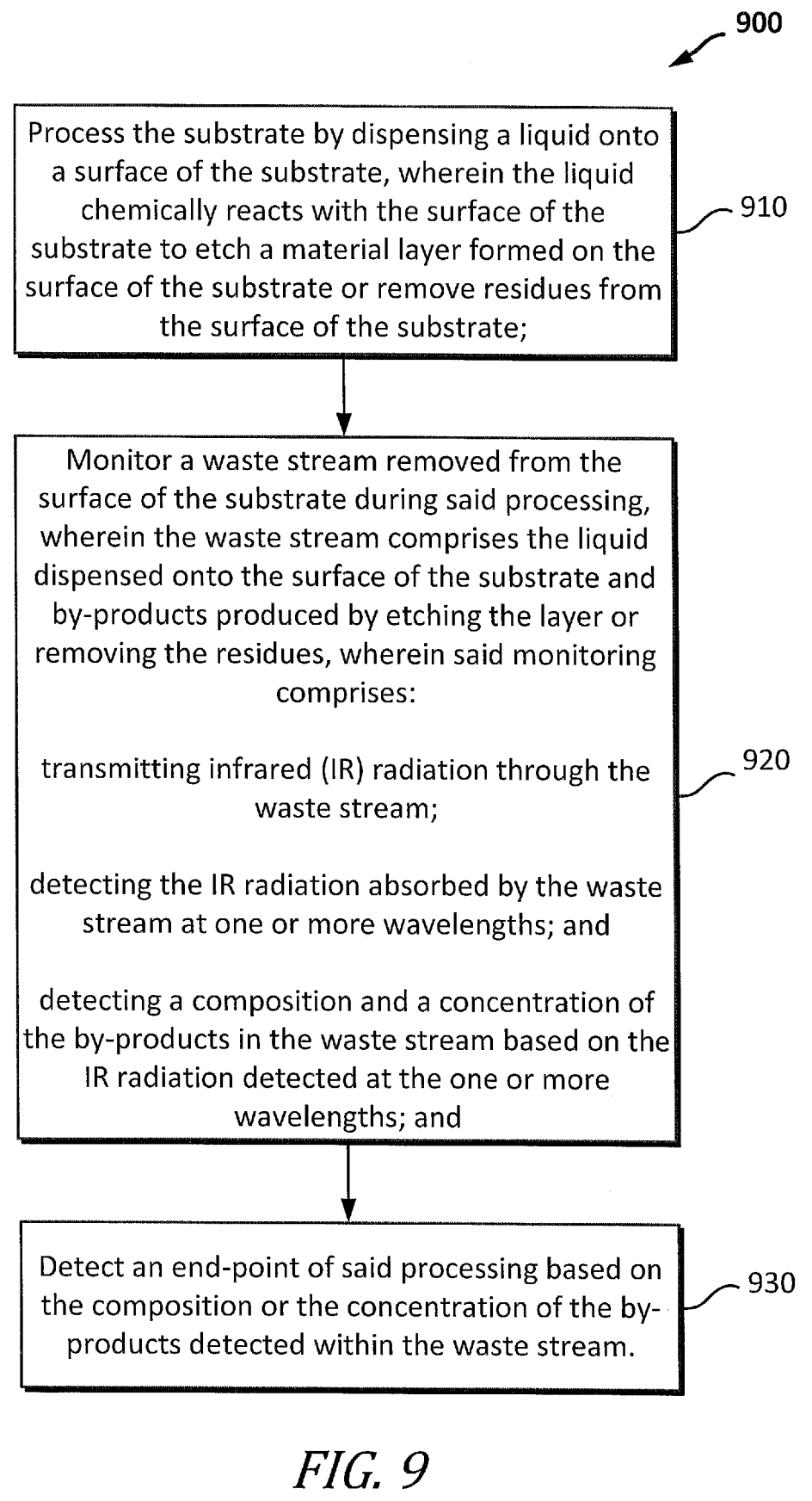

Process the substrate by dispensing a liquid onto a surface of the substrate, wherein the liquid chemically reacts with the surface of the substrate to etch a material layer formed on the surface of the substrate or remove residues from the surface of the substrate; — 910

Monitor a waste stream removed from the surface of the substrate during said processing, wherein the waste stream comprises the liquid dispensed onto the surface of the substrate and by-products produced by etching the layer or removing the residues, wherein said monitoring comprises:

transmitting infrared (IR) radiation through the waste stream;

detecting the IR radiation absorbed by the waste stream at one or more wavelengths; and detecting a composition and a concentration of the by-products in the waste stream based on the IR radiation detected at the one or more wavelengths; and — 920

Detect an end-point of said processing based on the composition or the concentration of the by-products detected within the waste stream. — 930

*FIG. 9*

SYSTEMS AND METHODS THAT USE INFRARED (IR) SPECTROSCOPY TO MONITOR PROCESS CHEMICALS UTILIZED IN A SEMICONDUCTOR PROCESS

BACKGROUND

The present disclosure relates to the processing of substrates. In particular, it provides new systems and methods that utilize infrared (IR) spectroscopy techniques for monitoring semiconductor processes and chemicals used in such processes.

Traditional substrate processing systems utilize photolithography processes, which include coating, exposure, develop and bake steps. The materials and processes utilized in these steps may all impact film thickness, critical dimension targeting, line roughness, uniformity, etc. on a substrate. As geometries in substrate processing continue to shrink, the technical challenges to forming structures on substrates increase.

Some substrate processing systems (sometimes referred to as wet processing systems or tools) dispense liquids onto the surface of a semiconductor substrate to process the substrate. Examples of wet processing systems include coating tools, developing tools, etching tools and surface preparation tools. Coating tools can be used to dispense a wide variety of liquid materials onto the surface of a semiconductor substrate to deposit a wide variety of material layers or films onto the substrate surface. Developing tools dispense developing solutions and etching tools dispense etch solutions onto the substrate surface to remove various material layers (or portions of material layers) that are exposed on the substrate surface. Surface preparation tools may be used to dispense cleaning solutions onto the substrate surface to clean the substrate surface and/or prepare the substrate surface for a subsequent processing step.

Wet processing systems are used in a wide variety of semiconductor fabrication processes, including the formation of photoresists. For example, a coating tool may dispense a liquid material, which contains components that are responsive to ultra-violet (UV) radiation, onto the surface of a semiconductor substrate in order to cast a UV-active photoresist film on the substrate surface. After performing a photolithography step, in which portions of the UV-active photoresist film are exposed to UV radiation to convert exposed portions of the UV-active photoresist film to a reacted photoresist, a developing tool may dispense a developing solution onto the substrate surface to remove a portion of the photoresist film for patterning, thus providing a photoresist pattern on the substrate. In some cases, a surface preparation tool may dispense a cleaning solution onto the surface of the substrate during substrate processing to clean or etch the substrate surface.

The composition and/or concentration of process chemicals used within wet processing systems can gradually change over time for a variety of reasons including, but not limited to, the inherent instability of the process chemicals, exposure to pumping/purging mechanisms, diffusion through process lines, and chemical reactions that occur during processing and over time. These uncontrolled changes in chemistry can have negative impacts on device metrics, such as film thickness and critical dimension (CD) uniformity. Monitoring the composition and/or concentration of the process chemicals used within wet processing systems in real-time would enable better process control, resulting in improved device performance and yield.

Infrared (IR) light, which is invisible to human eyes, has been used in a wide variety of applications, such as optical communication, night vision, light detection and ranging, thermal imaging (temperature monitoring), biomedical imaging, IR spectroscopy, etc. The IR spectrum can be divided based on wavelength (λ) into five categories: near-infrared (NIR, λ=0.75-1.4 μm), short-wave infrared (SWIR, λ=1.4-3 μm), mid-wave infrared (MWIR, λ=3-8 μm), long-wave infrared (LWIR, λ=8-15 μm), and far infrared (FIR, λ=15-1000 μm). The NIR and SWIR spectral ranges are particularly useful for determining the molecular structure of liquid, gas and solid samples using IR spectroscopy.

IR spectroscopy is the analysis of the interaction of IR radiation with molecules by absorption, emission or reflection. When a molecule absorbs IR radiation, the absorption causes vibrational transitions in the molecule due to stretching and/or bending of the molecular bonds. Since the energies involved in bond stretching and bending differ for different kinds of bonds, different bonds will absorb different frequencies (or wavelengths) of IR radiation to jump from one vibrational level to another. IR absorption spectroscopy monitors the IR radiation transmitted through a sample (e.g., a liquid, gas or solid) and detects the wavelengths at which molecules within the sample absorb the IR radiation. Since molecular bonds can vibrate in several different motions (stretching and/or bending), individual bonds may absorb IR radiation at more than one IR wavelength, resulting in more than one IR absorption peak. For example, water ($H_2O$) has IR absorption peaks at 1450 nm and 1950 nm due to the O—H bond stretch and combination of O—H bond stretch and bend, respectively. Organic chemicals have absorption peaks at additional wavelengths due to the stretching and/or bending of C—H bonds, C—C bonds, C═C bonds, C═O bonds, etc., as well as functional groups containing $CH_2$, $CH_3$, $CO_2H$, ROH, $ArCH_2$, etc. By identifying the IR absorption peaks corresponding to different bonds or functional groups within the sample, the IR spectroscopy results can be used to determine the molecular structure or composition of the sample.

SUMMARY

Various embodiments of improved systems and methods are provided to monitor process chemicals used in a semiconductor process. More specifically, the present disclosure provides new semiconductor processing systems and methods that utilize infrared (IR) spectroscopy techniques to monitor the composition and/or concentration of process chemicals utilized to process a substrate and/or the by-products produced during substrate processing. By monitoring the process chemicals and/or the by-products in real-time, as a process is performed on the substrate, the systems and methods described herein can be used to provide better process control and/or end-point detection for a wide variety of semiconductor processes.

In the embodiments disclosed herein, an IR monitoring system is provided within a semiconductor processing system to provide real-time monitoring of process chemicals used to process a substrate and/or the by-products produced during substrate processing. The IR monitoring system can be provided within a wide variety of semiconductor processing systems or tools. For example, the IR monitoring system can be provided within a coating tool, a developing tool, an etching tool, a surface preparation tool or another wet processing tool.

In some embodiments, the IR monitoring system can be used to monitor the composition and/or concentration of process chemicals utilized within a wet processing tool for processing a substrate. By monitoring the composition and/or concentration of the process chemicals in real-time, the systems and methods disclosed herein can use the IR monitoring results to adjust process condition(s) dynamically, as various process step(s) is/are performed, thereby providing better process control and resulting in improved device performance and yield.

In other embodiments, the IR monitoring system can be used to monitor the composition and/or concentration of by-products produced as a result of wet processes performed within a wet processing tool. By monitoring the composition and/or concentration of the by-products in real-time, the systems and methods disclosed herein can use the IR monitoring results to detect an end-point for the wet process.

According to one embodiment, a method is provided herein to monitor process chemicals used in a semiconductor process. The method may generally include dispensing a liquid onto a surface of a substrate and monitoring the liquid before the liquid is dispensed onto the surface of the substrate. The monitoring step may generally include: transmitting infrared (IR) radiation through the liquid; detecting the IR radiation absorbed by the liquid at one or more wavelengths; and detecting a composition and a concentration of at least one process chemical included within the liquid based on the IR radiation detected at the one or more wavelengths. The method may further include controlling at least one process step performed on the substrate based on the composition or the concentration of the at least one process chemical detected within the liquid. In doing so, the method can be used to improve process control in the semiconductor process.

The method can be used to improve process control in a wide variety of semiconductor fabrication processes. In some embodiments, the method may be used to monitor and control water contamination in photoresist films formed on a substrate. In other embodiments, the method may be used to monitor and control mixing of process chemicals included within a solution before the solution is dispensed onto the substrate.

When the method is used to monitor and control water contamination in photoresist films, the liquid dispensed onto the surface of the substrate may include a liquid photoresist material, and the monitoring step may include detecting a concentration of water ($H_2O$) in the liquid photoresist material based on the IR radiation detected at 1450 nm and/or 1950 nm. In some embodiments, the liquid photoresist material may be one which is used to form a metal oxide photoresist film. For example, the liquid photoresist material may include an organometallic oxide, which contains a central metal atom selected from a group consisting of tin (Sn), zirconium (Zr), indium (In), antimony (Sb), gallium (Ga), bismuth (Bi), zinc (Zn), titanium (Ti), hafnium (Hf), aluminum (Al), or combinations thereof.

In some embodiments, the method may control the concentration of water in the liquid photoresist material before the liquid photoresist material is dispensed onto the surface of the substrate to coat the surface of the substrate with the liquid photoresist material. For example, the method may control an amount of water or solvent that is mixed with the liquid photoresist material before the liquid photoresist material is dispensed. In other embodiments, the method may control at least one operational parameter of one or more process steps performed on the substrate after the liquid photoresist material is dispensed onto the surface of the substrate. For example, the method may control: (a) an exposure time or dose used during an exposure step, which is performed on the substrate after the liquid photoresist material is dispensed onto the surface of the substrate, (b) a bake time or temperature used during a bake step, which is performed on the substrate before or after the exposure step, and/or (c) a develop time or developing solution concentration used during a developing step, which is performed on the substrate after the exposure step. In either embodiment, the concentration of water in the liquid photoresist material and the at least one operational parameter of the one or more process steps may be controlled based on the concentration of water detected in the liquid photoresist material.

When the method is used to monitor and control mixing of process chemicals included within a solution (or chemical mixture), the liquid dispensed onto the surface of the substrate may include a plurality of process chemicals. For example, the liquid dispensed onto the surface of the substrate may include a plurality of process chemicals, which are mixed together within a coating solution, a developing solution, an etching solution or a cleaning solution. The method may detect a composition and a concentration of each process chemical included within the solution based on the IR radiation detected at wavelengths corresponding to each process chemical, and may control mixing of the plurality of process chemicals, based on the detected composition and concentration of each process chemical, before the solution is dispensed onto the surface of the substrate.

The method can be used to control mixing of a wide variety of process chemicals, which are used in a wide variety of semiconductor processes. For example, the method can be used to control relative amounts of process chemicals, which are mixed together to produce the liquid before the liquid is dispensed onto the surface of the substrate to: (a) coat the surface of the substrate with a liquid photoresist material, (b) develop a photoresist film on the surface of the substrate, or (c) clean the surface of the substrate.

In some embodiments, the method may control mixing of process chemicals provided within a coating solution. For example, the method may control an amount of water ($H_2O$) or solvent that is mixed with a photoresist material to produce the liquid, or control an amount of a water/solvent mixture that is mixed with the photoresist material to produce the liquid, before the liquid is dispensed onto the surface of the substrate to coat the surface of the substrate with the photoresist material. The method may control the amount of water or solvent mixed with the photoresist material based on the concentration of water or solvent that is detected within the liquid during said monitoring.

In other embodiments, the method may control mixing of process chemicals provided within a developing solution, an etching solution or a cleaning solution. In one example, the method may control an amount of sulfuric acid ($H_2SO_4$) that is mixed with an amount of hydrogen peroxide ($H_2O_2$) to produce peroxymonosulfuric acid ($H_2SO_5$, otherwise known as Caro's acid). The method may control relative amounts of $H_2SO_4$ mixed with $H_2O_2$ to form Caro's acid based on a concentration of $H_2SO_4$ and a concentration of $H_2O_2$ detected within the liquid during said monitoring.

In another example, the method may control an amount of phosphoric acid ($H_3PO_4$) that is mixed with an amount of water ($H_2O$) to produce an aqueous phosphoric acid solution. The method may control the relative amounts of $H_3PO_4$ mixed with $H_2O$ based on a concentration of $H_3PO_4$ and a concentration of $H_2O$ detected within the liquid during said monitoring.

In yet another example, the method may control an amount of isopropyl alcohol (IPA, $C_3H_8O$) that is mixed with an amount of tetramethyl ammonium hydroxide (TMAH, $C_4H_{13}NO$) to produce a TMAH solution. The method may control the relative amounts of IPA and TMAH based on a concentration of IPA and a concentration of TMAH detected within the liquid during said monitoring.

According to another embodiment, an infrared (IR) monitoring system is provided within a semiconductor processing system for monitoring process chemicals used within the semiconductor processing system. The IR monitoring system can be provided within a wide variety of semiconductor processing systems or tools. For example, the IR monitoring system can be provided within a coating tool, a developing tool, an etching tool, a surface preparation tool or another wet processing tool.

The IR monitoring system described herein may generally include an infrared (IR) light source, an optical photodetector and a controller. The IR light source is positioned within the semiconductor processing system to transmit IR radiation through a liquid, which is used to process a substrate disposed within a processing chamber of the semiconductor processing system. The liquid may include one or more process chemicals, and the IR light source may include one or more light emitting diodes (LEDs) with emission wavelengths corresponding to IR absorption peaks of the one or more process chemicals. The optical photodetector is positioned within the semiconductor processing system to detect the IR radiation transmitted through the liquid and generate an output signal in response thereto. The controller is coupled to receive the output signal from the optical photodetector and configured to analyze the output signal to: (a) detect the IR radiation absorbed by the one or more process chemicals at one or more wavelengths, and (b) detect a composition and a concentration of the one or more process chemicals based on the IR radiation detected at the one or more wavelengths. In some embodiments, the controller, or another controller coupled to control components within the semiconductor processing system, may be configured to control at least one process step performed on the substrate based on the composition or the concentration of the one or more process chemicals detected within the liquid.

In some embodiments, the IR monitoring system may be used to monitor and control water contamination in photoresist films. In such embodiments, the liquid used to process the substrate may include a liquid photoresist material. For example, the liquid photoresist material may include an organometallic oxide containing a central metal atom of tin (Sn), zirconium (Zr), indium (In), antimony (Sb), gallium (Ga), bismuth (Bi), zinc (Zn), titanium (Ti), hafnium (Hf), aluminum (Al), or combinations thereof.

When the IR monitoring system is used to monitor and control water contamination in photoresist films, the controller may be configured to analyze the output signal to detect a concentration of water ($H_2O$) in the liquid photoresist material based on the IR radiation detected at 1450 nm and/or 1950 nm, and control at least one of: (a) the concentration of water in the liquid photoresist material before the liquid photoresist material is dispensed onto a surface of the substrate during a first process step to coat the surface of the substrate with the liquid photoresist material; and (b) at least one operational parameter of one or more process steps performed on the substrate after the first process step, based on the analysis results.

For example, the controller may be configured to control an amount of water or solvent that is mixed with the liquid photoresist material, before the liquid photoresist material is dispensed onto the surface of the substrate, based on the concentration of water detected within the liquid photoresist material. Alternatively, the controller may be configured to control, based on the concentration of water detected in the liquid photoresist material, at least one of: (a) an exposure time or dose used during an exposure step, which is performed on the substrate after the liquid photoresist material is dispensed onto the surface of the substrate to coat the surface of the substrate with the liquid photoresist material; (b) a bake time or temperature used during a bake step, which is performed on the substrate before or after the exposure step; and (c) a develop time used during a developing step, which is performed on the substrate after the exposure step.

As noted above, the IR light source may generally include one or more LEDs. In some embodiments, the IR light source may include a single LED that emits IR radiation within a small subset of narrow-band emission wavelengths, which correspond to an IR absorption peak associated with a functional group within a particular process chemical. For example, the single LED may have an emission wavelength range that is sufficient for detecting water in liquid photoresist materials. In other embodiments, the IR light source may include a plurality of LEDs having a plurality of narrow-band emission wavelengths, each corresponding to a different IR absorption peak associated with functional groups included within one or more process chemicals. When multiple LEDs are used, the extra wavelengths can be used to distinguish the concentration of multiple species within the process chemical(s). For example, the extra emission wavelengths provided by multiple LEDs can be used to distinguish the amount of water contamination vs. solvent concentration in liquid photoresist materials. The optical photodetector may generally include one or more photodiodes, which are configured to detect the IR radiation emitted by the one or more LEDs. The wavelength of IR radiation emitted by the LED(s) and detected by the photodiode(s) may generally depend on the process chemical(s) being monitored by the IR monitoring system.

In some embodiments, the IR monitoring system may further include a fiber optic coupler and splitter, which is coupled to divide the IR radiation transmitted from the IR light source into a sample path and a reference path. The sample path transmits the IR radiation through the liquid to the optical photodetector, while the reference path transmits the IR radiation to the optical photodetector without transmitting the IR radiation through the liquid. The optical photodetector detects the IR radiation transmitted through the sample path and the IR radiation transmitted through the reference path and generates an output signal representing a difference between the IR radiation transmitted through the sample path and the IR radiation transmitted through the reference path. In some embodiments, the controller may analyze the output signal generated by the optical photodetector to detect the IR radiation absorbed by the one or more process chemicals and determine, based on the detected IR radiation, functional groups included within each of the one or more process chemicals and an absolute concentration of the one or more process chemicals.

The IR sensing hardware (e.g., the IR light source, fiber optic coupler and splitter, sample path and/or optical photodetector detector) of the IR monitoring system may be incorporated within the semiconductor processing system at variety of different locations. For example, the IR monitoring system may be coupled to a chemical supply system that is coupled to the semiconductor processing system to supply the liquid to the substrate, or a drain system that is coupled to the semiconductor processing system to receive a waste stream removed from the substrate.

The chemical supply system may generally include a plurality of chemical supply system components, which are coupled and configured to supply liquids to the substrate during substrate processing. At least one of the chemical supply system components may be at least partially transparent to the IR radiation emitted by the IR light source. In some embodiments, the IR light source may be coupled to transmit the IR radiation through at least one of the following chemical supply system components: (a) a reservoir comprising the liquid; (b) a nozzle coupled to dispense the liquid onto a surface of the substrate; (c) a process line coupled between the reservoir and the nozzle; (d) a pump in fluid communication with the process line; and (e) a trap tank in fluid communication with the process line.

The drain system may be coupled to receive a waste stream, which is ejected from the substrate and removed from the process chamber during substrate processing. The waste stream may include the liquid used to process the substrate and any by-products produced during the process. When used for monitoring by-products in the waste stream, the IR monitoring system may further include an additional IR light source coupled to the drain system to transmit IR radiation through the waste stream, and an additional optical photodetector coupled to detect the IR radiation absorbed by the waste stream and generate an additional output signal in response thereto. In such embodiments, the controller may be coupled to receive the additional output signal from the additional optical photodetector and analyze the additional output signal to: (i) detect the IR radiation absorbed by the waste stream at one or more wavelengths, (ii) detect a composition and a concentration of the by-products in the waste stream based on the IR radiation detected at the one or more wavelengths, and (iii) detect an end-point of the process based on the composition or the concentration of the by-products detected within the waste stream.

The IR monitoring system disclosed herein utilizes IR spectroscopy techniques to monitor the composition and/or concentration of process chemicals used to process a substrate and/or the by-products produced during substrate processing. In various example embodiments disclosed herein, the IR monitoring system may use IR spectroscopy to: (a) monitor and control water contamination in a semiconductor process, (b) monitor concentrations of process chemicals within chemical solutions and control process steps based on the detected concentrations of process chemicals, and (c) detect an end-point of a semiconductor process.

According to one embodiment, a method is provided to monitor and control water contamination in a semiconductor process used to process a substrate. The method may generally include dispensing a liquid photoresist material onto a surface of the substrate and monitoring the liquid photoresist material before the liquid photoresist material is dispensed onto the surface of the substrate to coat the surface of the substrate with the liquid photoresist material. In some embodiments, the liquid photoresist material may include an organometallic oxide containing a central metal atom of tin (Sn), zirconium (Zr), indium (In), antimony (Sb), gallium (Ga), bismuth (Bi), zinc (Zn), titanium (Ti), hafnium (Hf), aluminum (Al), or combinations thereof. The monitoring step may generally include: transmitting infrared (IR) radiation through the liquid photoresist material; detecting the IR radiation absorbed by the liquid photoresist material at one or more wavelengths; and detecting a concentration of water ($H_2O$) in the liquid photoresist material based on the IR radiation detected at 1450 nm and/or 1950 nm. The method may further include controlling at least one process step performed on the substrate based on the concentration of water detected in the liquid photoresist material.

In some embodiments, the method may control the at least one process step performed on the substrate by controlling at least one of: (a) the concentration of water in the liquid photoresist material before the liquid photoresist material is dispensed onto the surface of the substrate during a first process step to coat the surface of the substrate with the liquid photoresist material; and (b) at least one operational parameter of one or more process steps performed on the substrate after the first process step. For example, the method may control the concentration of water in the liquid photoresist material by controlling an amount of water ($H_2O$) or solvent that is mixed with the liquid photoresist material, or controlling an amount of a water/solvent mixture that is mixed with the liquid photoresist material, wherein said controlling is based on the concentration of water detected within the liquid photoresist material during said monitoring.

In addition or alternatively, the method may control the at least one operational parameter of the one or more process steps by controlling at least one of: (a) an exposure time or dose used during an exposure step, which is performed on the substrate after the liquid photoresist material is dispensed onto the surface of the substrate to coat the surface of the substrate with the liquid photoresist material; (b) a bake time or temperature used during a bake step, which is performed on the substrate before or after the exposure step; and (c) a develop time or developing solution concentration used during a developing step, which is performed on the substrate after the exposure step. In such embodiments, the method may control the at least one operational parameter of the one or more process steps based on the concentration of water detected in the liquid photoresist material.

According to another embodiment, a method is provided to control a semiconductor process based on a concentration of process chemicals used in the semiconductor process. The method may generally include dispensing a liquid onto a surface of a substrate, wherein the liquid comprises a plurality of different process chemicals, and monitoring the liquid before the liquid is dispensed onto the surface of the substrate. In this embodiment, the monitoring step may include: transmitting infrared (IR) radiation through the liquid; detecting the IR radiation absorbed by the liquid at one or more wavelengths; and detecting a composition and a concentration of each process chemical included within the liquid based on the IR radiation detected at wavelengths corresponding each process chemical. The method may further include controlling at least one process step performed on the substrate based on the concentration of each process chemical detected within the liquid.

In some embodiments, the method may control the at least one process step performed on the substrate by controlling mixing of the plurality of different process chemicals before the liquid is dispensed onto the surface of the substrate, wherein said mixing is controlled based on the detected composition and concentration of each process chemical. The method can be used to control mixing of a wide variety of process chemicals, which are used in a wide variety of semiconductor processes.

In some embodiments, the method may control mixing of process chemicals provided within a coating solution. For example, the method may control an amount of water ($H_2O$) or solvent that is mixed with a photoresist material to produce the liquid, or control an amount of a water/solvent mixture that is mixed with the photoresist material to produce the liquid, before the liquid is dispensed onto the surface of the substrate to coat the surface of the substrate with the photoresist material. The method may control the amount of water or solvent mixed with the photoresist material based on the concentration of water or solvent that is detected within the liquid during said monitoring.

In other embodiments, the method may control mixing of process chemicals provided within a developing solution, an etching solution or a cleaning solution. In one example, the method may control an amount of sulfuric acid ($H_2SO_4$) that is mixed with an amount of hydrogen peroxide ($H_2O_2$) to produce peroxymonosulfuric acid ($H_2SO_5$, otherwise known as Caro's acid). The method may control relative amounts of $H_2SO_4$ mixed with $H_2O_2$ to form Caro's acid based on a concentration of $H_2SO_4$ and a concentration of $H_2O_2$ detected within the liquid during said monitoring. In another example, the method may control an amount of phosphoric acid ($H_3PO_4$) that is mixed with an amount of water ($H_2O$) to produce an aqueous phosphoric acid solution. The method may control the relative amounts of $H_3PO_4$ mixed with $H_2O$ based on a concentration of $H_3PO_4$ and a concentration of $H_2O$ detected within the liquid during said monitoring. In yet another example, the method may control an amount of isopropyl alcohol (IPA, $C_3H_8O$) that is mixed with an amount of tetramethyl ammonium hydroxide (TMAH, $C_4H_{13}NO$) to produce a TMAH solution. The method may control the relative amounts of IPA and TMAH based on a concentration of IPA and a concentration of TMAH detected within the liquid during said monitoring.

In other embodiments, the method may control the at least one process step performed on the substrate by controlling at least one operational parameter of one or more process steps performed on the substrate after the liquid is dispensed onto the surface of the substrate to coat the surface of the substrate with the liquid. For example, the method may control the at least one operational parameter of the one or more process steps by controlling at least one of: (a) an exposure time or dose used during an exposure step, which is performed on the substrate after the liquid is dispensed onto the surface of the substrate to coat the surface of the substrate with the liquid; (b) a bake time or temperature used during a bake step, which is performed on the substrate before or after the exposure step; and (c) a develop time or developing solution concentration used during a developing step, which is performed on the substrate after the exposure step. In such embodiments, the method may control the at least one operational parameter based on the concentration of each process chemical detected within the liquid during said monitoring.

According to another embodiment, a method is provided to detect an end-point of a process used to process a substrate. The method may generally include processing the substrate by dispensing a liquid onto a surface of the substrate, wherein the liquid chemically reacts with the surface of the substrate to etch a material layer formed on the surface of the substrate or remove residues from the surface of the substrate. The method may further include monitoring a waste stream removed from the surface of the substrate during said processing, wherein the waste stream includes the liquid dispensed onto the surface of the substrate and by-products produced by etching the material layer or removing the residues. In this embodiment, the monitoring step may include: transmitting infrared (IR) radiation through the waste stream; detecting the IR radiation absorbed by the waste stream at one or more wavelengths; and detecting a composition and a concentration of the by-products in the waste stream based on the IR radiation detected at the one or more wavelengths. The method may further include detecting an end-point of said processing based on the composition or the concentration of the by-products detected within the waste stream. In some embodiments, the method may further include terminating said processing upon detecting the end-point of said processing.

In some embodiments, the substrate may be processed by dispensing a solution onto the surface of the substrate to etch the material layer formed on the surface of the substrate or remove the residues from the surface of the substrate. For example, a cleaning or etching solution (such as, e.g., an APM solution, HPM solution, TMAH solution or phosphoric acid solution) may be dispensed onto the surface of the substrate to etch a material layer formed on the surface of the substrate or remove residues from the substrate surface. In such embodiments, the method may detect an end-point of the process based on the composition or the concentration of the by-products detected within the waste stream. The by-products detected within the waste stream may depend on a variety of factors, such as the layer(s) being etched, the residues being removed and the chemical composition of the cleaning/etching solution.

As noted above and described further herein, the present disclosure provides various embodiments of methods that utilizes IR spectroscopy techniques to monitor the composition and/or concentration of process chemicals used to process a substrate and/or the by-products produced during substrate processing. Of course, the order of discussion of the different steps as described herein has been presented for the sake of clarity. In general, these steps can be performed in any suitable order. Additionally, although each of the different features, techniques, configurations, etc. herein may be discussed in different places of this disclosure, it is intended that each of the concepts can be executed independently of each other or in combination with each other. Accordingly, the present invention can be embodied and viewed in many different ways.

Note that this Summary section does not specify every embodiment and/or incrementally novel aspect of the present disclosure or claimed inventions. Instead, the summary only provides a preliminary discussion of different embodiments and corresponding points of novelty over conventional techniques. For additional details and/or possible perspectives of the invention and embodiments, the reader is directed to the Detailed Description section and corresponding figures of the present disclosure as further discussed below.

BRIEF DESCRIPTION OF THE DRAWINGS

A more complete understanding of the present inventions and advantages thereof may be acquired by referring to the following description taken in conjunction with the accompanying drawings, in which like reference numbers indicate like features. It is to be noted, however, that the accompanying drawings illustrate only exemplary embodiments of the disclosed concepts and are therefore not to be considered limiting of the scope, for the disclosed concepts may admit to other equally effective embodiments.

FIG. 5A is a perspective three-dimensional (3D) diagram of a chemical process line that is transparent to IR light.

FIG. 5B is a perspective 3D diagram of an IR transparent flow-cell incorporated into a chemical process line.

FIG. 5C is a perspective 3D diagram illustrating a plurality of chemical process lines incorporated into a nozzle holder, where each of the plurality of chemical process lines is transparent to IR light.

FIG. 8 is a flowchart diagram illustrating one embodiment of a method that utilizes the techniques described herein to control a semiconductor process based on a concentration of process chemicals used in the semiconductor process.

FIG. 9 is a flowchart diagram illustrating one embodiment of a method that utilizes the techniques described herein to detect an end-point of a process used to process a substrate.

DETAILED DESCRIPTION

Figure 1:
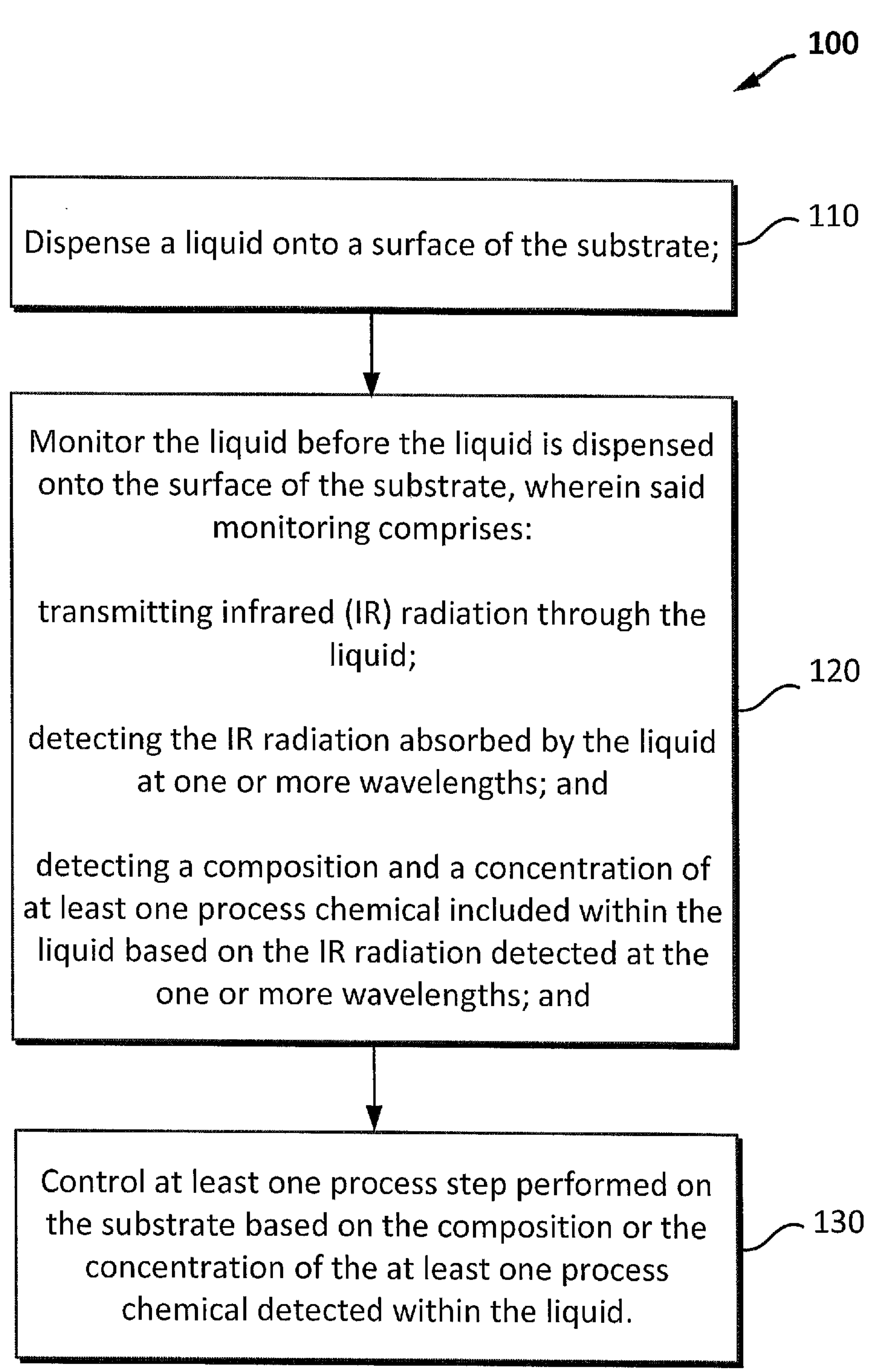
FIG. 1 is a flowchart diagram illustrating one embodiment of a method that utilizes the techniques described herein to monitor process chemicals used in a semiconductor process.

The present disclosure provides various embodiments of improved systems and methods to monitor process chemicals used in a semiconductor process. More specifically, the present disclosure provides new semiconductor processing systems and methods that utilize infrared (IR) spectroscopy techniques to monitor the composition and/or concentration of process chemicals utilized to process a substrate and/or the by-products produced during substrate processing. By monitoring the process chemicals and/or the by-products in real-time, as a process is performed on the substrate, the systems and methods described herein can be used to provide better process control and/or end-point detection for a wide variety of semiconductor processes.

In the embodiments disclosed herein, an IR monitoring system is provided within a semiconductor processing system to provide real-time monitoring of process chemicals used to process a substrate and/or the by-products produced during substrate processing. The IR monitoring system can be provided within a wide variety of semiconductor processing systems or tools. For example, the IR monitoring system can be provided within a coating tool, a developing tool, an etching tool, a surface preparation tool or another wet processing tool.

In some embodiments, the IR monitoring system can be used to monitor the composition and/or concentration of process chemicals utilized within a wet processing tool for processing a substrate. By monitoring the composition and/or concentration of the process chemicals in real-time, the systems and methods disclosed herein can use the IR monitoring results to adjust process condition(s) dynamically, as various process step(s) is/are performed, thereby providing better process control and resulting in improved device performance and yield.

In some embodiments, the IR monitoring system can be used to monitor the composition and/or concentration of by-products produced as a result of wet processes performed within a wet processing tool. By monitoring the composition and/or concentration of the by-products in real-time, the systems and methods disclosed herein can use the IR monitoring results to detect an end-point for the wet process.

The IR monitoring system disclosed herein utilizes IR spectroscopy techniques to monitor the composition and/or concentration of process chemicals and by-products. As described in more detail below, the IR monitoring system disclosed herein generally includes an IR light source for transmitting IR radiation through a liquid, an optical photodetector for detecting the IR radiation absorbed by the liquid and generating an output signal in response thereto, and a controller for analyzing the output signal to detect IR absorption peaks (or wavelengths) corresponding to process chemical(s) and/or by-products included within the liquid. In some embodiments, the IR radiation may be transmitted through a liquid (e.g., a processing liquid, such as a coating solution, a developing solution, an etching solution or a cleaning solution), which is dispensed onto a surface of the substrate for processing the substrate, and the IR monitoring results may be used to adjust process condition(s) dynamically to provide better process control. In other embodiments, the IR radiation may be transmitted through a liquid (e.g., a waste stream), which is ejected or otherwise removed from the substrate during processing, and the IR monitoring results may be used to detect an end-point of the process.

The IR monitoring system disclosed herein can be used to monitor a wide variety of organic and inorganic process chemicals and chemical solutions typically used in coating, developing, etching and/or surface preparation tools. For example, the IR monitoring system may be used to monitor a wide variety of process chemicals used within coating solutions, developing solutions, etching solutions and cleaning solutions. The IR monitoring system can also be used to monitor a wide variety of by-products produced as a result of processing a substrate with such solutions. For example, the IR monitoring system may be used to monitor by-products produced when etching a layer formed on a substrate surface or removing residues from the substrate surface. The process chemicals and/or by-products monitored by the IR monitoring system disclosed herein may generally have IR absorption peaks at one or more wavelengths that fall within the near-IR (NIR, $\lambda$=0.75-1.4 μm), short-wave IR (SWIR, $\lambda$=1.4-3 μm) and/or mid-wave IR (MWIR, $\lambda$=3-8 μm) spectral range.

IR Spectroscopy in Semiconductor Processes

As noted above, the absorption of IR radiation by process chemicals is dependent on their molecular structure (chemical moieties and bonds) and the vibrational motion (e.g., stretching and/or bending) of the bonds when IR radiation is absorbed by the molecules. For example, water ($H_2O$) has IR absorption peaks at 1450 nm and 1950 nm due to the O—H bond stretch and combination of O—H bond stretch and bend, respectively. Other process chemicals commonly used in semiconductor manufacturing (e.g., hydrocarbons, oxidizers, acids, alcohols, alkanes, amines, ethers, aldehydes, ketones, etc.) have IR absorption peaks at additional wavelengths due to the stretching and/or bending of O—H bonds, C—H bonds, C—C bonds, C═C bonds, C═O bonds, etc., as well as functional groups containing $CH_2$, $CH_3$, $CO_2H$, ROH, $ArCH_2$, etc., within such process chemicals.

IR spectroscopy monitors the IR radiation transmitted through a sample (e.g., a liquid, gas or solid) and detects the wavelengths at which molecules within the sample absorb the IR radiation. By identifying the IR absorption peaks (or wavelengths) corresponding to different bonds or functional groups within the sample, IR spectroscopy results can be used to determine the molecular structure or composition of the sample. The various embodiments disclosed herein use IR spectroscopy techniques to monitor the composition and concentration of process chemicals and chemical solutions used in a semiconductor process by measuring the IR absorption of the process chemicals at specific wavelengths, which correspond to the vibrational motion (e.g., stretching and/or bending) of the various bonds or functional groups within the process chemicals.

FIG. 1 illustrates one embodiment of a method 100 that utilizes the IR spectroscopy techniques described herein to monitor process chemicals used in a semiconductor process. It will be recognized that the embodiment shown in FIG. 1 is merely exemplary and additional methods may utilize the techniques described herein. Further, additional processing steps may be added to the method shown in the FIG. 1 as the steps described are not intended to be exclusive. Moreover, the order of the steps is not limited to the order shown in the figures as different orders may occur and/or various steps may be performed in combination or at the same time.

The method 100 shown in FIG. 1 includes dispensing a liquid onto a surface of a substrate (in step 110) and monitoring the liquid before the liquid is dispensed onto the surface of the substrate (in step 120). During the monitoring step (step 120), the method 100: (a) transmits infrared (IR) radiation through the liquid, (b) detects the IR radiation absorbed by the liquid at one or more wavelengths, and (c) detects a composition and a concentration of at least one process chemical included within the liquid based on the IR radiation detected at the one or more wavelengths. In step 130, the method 100 controls at least one process step performed on the substrate based on the composition or the concentration of the at least one process chemical detected within the liquid. In doing so, the method 100 can be used to improve process control in the semiconductor process.

The method 100 shown in FIG. 1 can be used to improve process control in a wide variety of semiconductor fabrication processes. In some embodiments, the method 100 may be used to monitor and control water contamination in photoresist films formed on a substrate. Water contamination is particularly problematic in metal oxide photoresist films and has been linked to lithography processing defects, such as particle defects and inadequate critical dimension (CD) uniformity, in such films. Thus, some embodiments of the method 100 may be used to monitor and control water contamination in metal oxide photoresist films to reduce lithography processing defects and improve device performance and yield. Method 100 may also be used for other purposes, as described in more detail below.

When the method 100 is used to monitor and control water contamination in photoresist films, the liquid dispensed onto the surface of the substrate (in step 110) may include a liquid photoresist material. Although not strictly limited to such, the liquid photoresist material dispensed in step 110 may be one which is used to form a metal oxide photoresist film. For example, the liquid photoresist material may include an organometallic oxide, which contains a central metal atom selected from a group consisting of tin (Sn), zirconium (Zr), indium (In), antimony (Sb), gallium (Ga), bismuth (Bi), zinc (Zn), titanium (Ti), hafnium (Hf), aluminum (Al), or combinations thereof. In one example embodiment, the organometallic oxide may contain a central metal atom of tin (Sn) and the liquid photoresist material may comprise tin oxide (SnO).

The method 100 may detect the concentration of water in the liquid photoresist material based on the IR radiation detected at 1450 nm and/or 1950 nm. In some embodiments, the method 100 may control the concentration of water in the liquid photoresist material before the liquid photoresist material is dispensed onto the surface of the substrate to coat the surface of the substrate with the liquid photoresist material. For example, the method 100 may control an amount of water or solvent (or an amount of water/solvent mixture) that is mixed with the liquid photoresist material before the liquid photoresist material is dispensed. In other embodiments, the method 100 may control at least one operational parameter of one or more process steps performed on the substrate later in the process flow after the liquid photoresist material is dispensed onto the surface of the substrate. For example, the method 100 may control: (a) an exposure time or dose used during an exposure step, which is performed on the substrate after the liquid photoresist material is dispensed onto the surface of the substrate, (b) a bake time or temperature used during a bake step, which is performed on the substrate before or after the exposure step, and/or (c) a develop time or developing solution concentration used during a developing step, which is performed on the substrate after the exposure step.

In other embodiments, the method 100 shown in FIG. 1 may be used to monitor and control mixing of process chemicals included within a chemical solution before the chemical solution is dispensed onto the substrate. For example, the liquid dispensed onto the surface of the substrate (in step 110) may include a plurality of process chemicals, which are mixed together within a coating solution, a developing solution, an etching solution or a cleaning solution. The method 100 detects a composition and a concentration of each process chemical included within the chemical solution based on the IR radiation detected at wavelengths corresponding each process chemical (in step 120), and controls mixing of the plurality of process chemicals, based on the detected composition and concentration of each process chemical, before the chemical solution is dispensed onto the surface of the substrate (in step 130).

The method 100 can be used to control mixing of a wide variety of process chemicals, which are used in a wide variety of semiconductor processes. For example, the method 100 can be used to control relative amounts of process chemicals, which are mixed together to produce the liquid before the liquid is dispensed onto the surface of the substrate to: (a) coat the surface of the substrate with a liquid photoresist material, (b) develop a photoresist film on the surface of the substrate, or (c) clean the surface of the substrate. Examples of process chemical solutions that can be monitored and controlled by method 100 are discussed in more detail below in reference to FIG. 8.

The method 100 shown in FIG. 1 uses IR spectroscopy techniques to monitor the composition and concentration of process chemicals used to process a substrate in a variety of semiconductor processes. By monitoring the composition and/or concentration of process chemicals in real-time, the method 100 can adjust process condition(s) dynamically, as various process step(s) is/are performed, to provide better process control and improve device performance and yield. Further embodiments discussed below use IR spectroscopy techniques to monitor the composition and/or concentration of by-products produced during a semiconductor process to detect an end-point for the semiconductor process.

IR Spectroscopy within a Semiconductor Processing System

Figure 2:
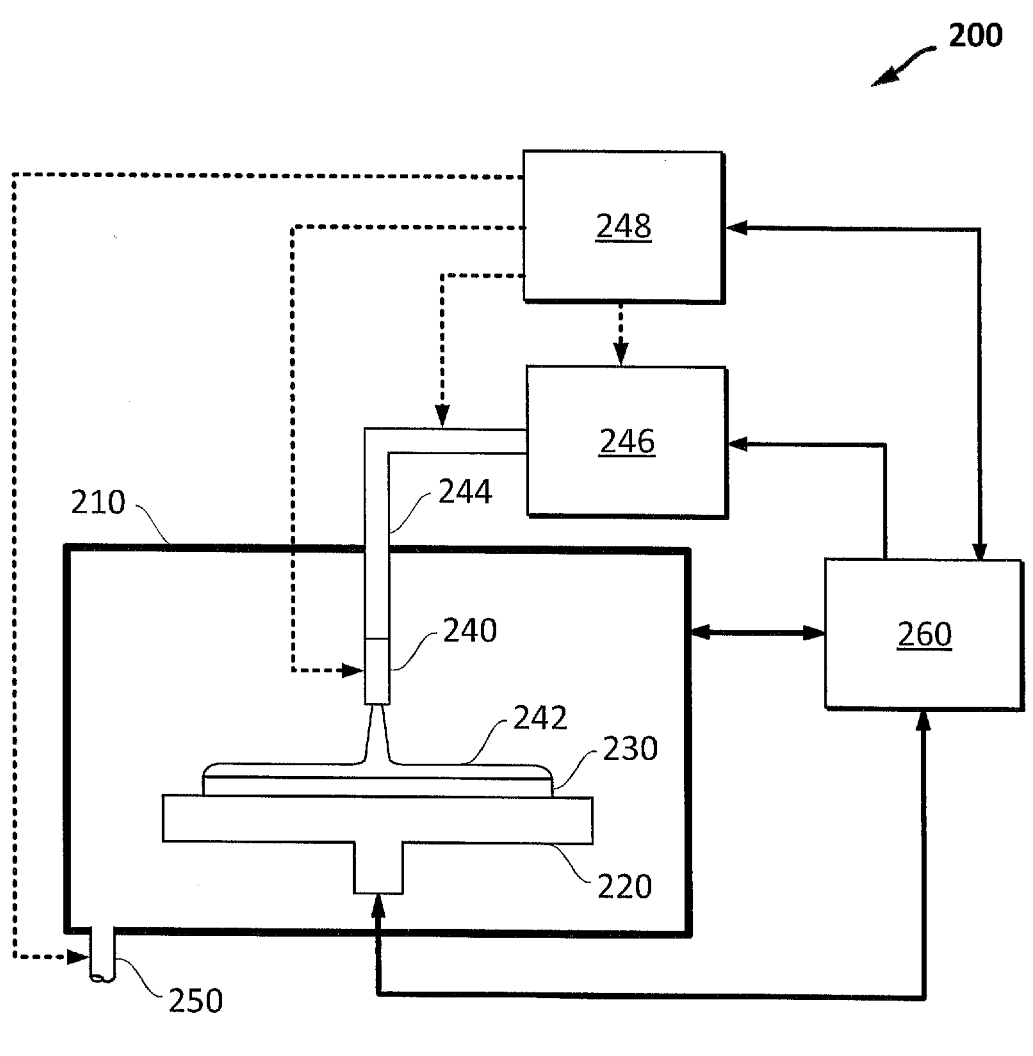
FIG. 2 is a block diagram illustrating one embodiment of a semiconductor processing system that includes an infrared (IR) monitoring system for monitoring the composition and/or concentration of process chemicals utilized to process a substrate and/or by-products produced during substrate processing.

FIG. 2 illustrates an example semiconductor processing system 200 in accordance with one embodiment of the present disclosure. More specifically, FIG. 2 illustrates a semiconductor processing system 200 that includes an IR monitoring system 248. As described in more detail below, the IR monitoring system 248 uses IR spectroscopy techniques to monitor the composition and/or concentration of process chemicals utilized to process a substrate and/or by-products produced during substrate processing. The semiconductor processing system 200 shown in FIG. 2 may be a coating tool, a developing tool, an etching tool, a surface preparation tool or another wet processing tool. As such, the IR monitoring system 248 may be used to monitor a wide variety of process chemicals and by-products of processing.

The semiconductor processing system 200 includes a process chamber 210, which in some embodiments, may be a pressure controlled chamber. In the embodiment shown in FIG. 2, the process chamber 210 is a spin chamber having a spinner 220 (or spin chuck), which is configured to spin or rotate at a rotational speed. A substrate 230 is held on the spinner 220, for example, via electrostatic force or vacuum pressure.

The substrate 230 held on the spinner 220 may be any substrate for which the patterning of the substrate is desirable. For example, in one embodiment, the substrate 230 may be a semiconductor substrate (or wafer) having one or more semiconductor processing layers (all of which together may comprise the substrate) formed thereon. Thus, in one embodiment, the substrate 230 may be a semiconductor substrate that has been subject to multiple semiconductor processing steps which yield a wide variety of structures and layers, all of which are known in the substrate processing art, and which may be considered to be part of the substrate 230. It is noted that the concepts disclosed herein may be utilized at any stage of the substrate process flow, such as for example, any of the numerous photolithography steps which may be utilized to form a completed substrate.

The semiconductor processing system 200 shown in FIG. 2 further includes a liquid nozzle 240, which is positioned over the substrate 230 for dispensing various liquids 242 onto a surface of the substrate 230. The liquids 242 dispensed by the liquid nozzle 240 may include a variety of liquids used to process the substrate 230. For example, the liquids 242 dispensed by the liquid nozzle 240 may include coating solutions, developing solutions, etching solutions and cleaning solutions. A wide variety of organic and inorganic process chemicals and chemical solutions typically used in coating, developing, etching and/or cleaning can be dispensed by the liquid nozzle 240, as is known in the art.

As shown in FIG. 2, the liquids 242 may be stored within a chemical supply system 246, which may include one or more reservoirs for holding the various liquids 242 and a chemical injection manifold, which is fluidly coupled to the process chamber 210 via a liquid supply line 244. In operation, the chemical supply system 246 may selectively apply desired process chemicals to the process chamber 210 via the liquid supply line 244 and the liquid nozzle 240 positioned within the process chamber 210. Thus, the chemical supply system 246 can be used to dispense the liquids 242 onto the surface of the substrate 230. The process chamber 210 may further include a drain system 250 for removing the liquids 242 from the process chamber 210.

The semiconductor processing system 200 shown in FIG. 2 further includes an IR monitoring system 248 for monitoring the composition and/or concentration of the liquids 242, which are dispensed onto the surface of the substrate 230 to process the substrate 230 and/or the by-products produced during substrate processing. As described in more detail below with reference to FIG. 3, the IR monitoring system 248 generally includes: (a) an IR light source for transmitting IR radiation through the liquids 242, (b) an optical photodetector for detecting the IR radiation absorbed by the liquids 242 and generating an output signal in response thereto, and (c) a controller, which is coupled to receive the output signal from the optical photodetector and analyze the output signal to: (i) detect the IR radiation absorbed by process chemical(s) included within the liquids 242 at one or more wavelengths, (ii) detect a composition and concentration of the process chemical(s) based on the IR radiation detected at the one or more wavelengths, and (iii) control at least one process step performed on the substrate 230 based on the composition or the concentration of the process chemical(s) detected within the liquids 242.

The IR monitoring system 248 is configured to monitor the liquids 242 provided by the chemical supply system 246 before the liquids 242 are dispensed onto the surface of the substrate 230. As described in more detail below with reference to FIGS. 4A-4B and FIGS. 5A-5C, the IR light source included within the IR monitoring system 248 may transmit IR radiation through various components of the chemical supply system 246 such as, but not limited to: (a) the one or more reservoirs holding the liquids 242, (b) the liquid nozzle 240 coupled to dispense the liquids 242 onto the surface of the substrate 230, (c) a process line (such as, but not limited to, liquid supply line 244) coupled between the reservoir(s) and the liquid nozzle 240, (d) a pump in fluid communication with the process line, (e) a trap tank in fluid communication with the process line, and (f) a drain or vent line of the chemical supply system.

In some embodiments, the IR monitoring system 248 may be additionally or alternatively configured to monitor a waste stream, which is ejected from the substrate 230 during processing and removed from the process chamber 210 via the drain system 250. The waste stream includes the liquids 242 used to process the substrate 230 and any by-products produced during the process. When used for monitoring by-products in the waste stream, the IR monitoring system 248 may include: (a) an IR light source coupled to the drain system 250 for transmitting IR radiation through the waste stream, (b) an optical photodetector coupled to detect the IR radiation absorbed by the waste stream and generate an additional output signal in response thereto, and (c) a controller, which is coupled to receive the output signal from the optical photodetector and analyze the output signal to: (i) detect the IR radiation absorbed by the waste stream at one or more wavelengths, (ii) detect a composition and concentration of the by-products in the waste stream based on the IR radiation detected at the one or more wavelengths, and (iii) detect an end-point of the process based on the composition or the concentration of the by-products detected within the waste stream.

Components of the semiconductor processing system 200 can be coupled to, and controlled by, a controller 260, which in turn, can be coupled to a corresponding memory storage unit and user interface (not shown). Various processing operations can be executed via the user interface, and various processing recipes and operations can be stored in the memory storage unit. Accordingly, a given substrate 230 can be processed within the process chamber 210 in accordance with a particular recipe. In some embodiments, a given substrate 230 can be processed within the process chamber 210 in accordance with a recipe that utilizes various coating, developing, etching and/or cleaning steps.

As shown in FIG. 2, the controller 260 is coupled to various components of the semiconductor processing system 200 to receive inputs from, and provide outputs to, the components. For example, the controller 260 is coupled to: the process chamber 210 for controlling the temperature and/or pressure within the process chamber 210; the spinner 220 for controlling the rotational speed of the spinner 220; and the chemical supply system 246 for controlling the various liquids 242, which are dispensed onto the surface of the substrate 230 to perform the various process steps. The controller 260 may control other processing system components not shown in FIG. 2, as is known in the art. In some embodiments, the IR monitoring system 248 shown in FIG. 3 may not include a controller. In such embodiments, the controller 260 may be used to perform the functionality described above.

Figure 3:
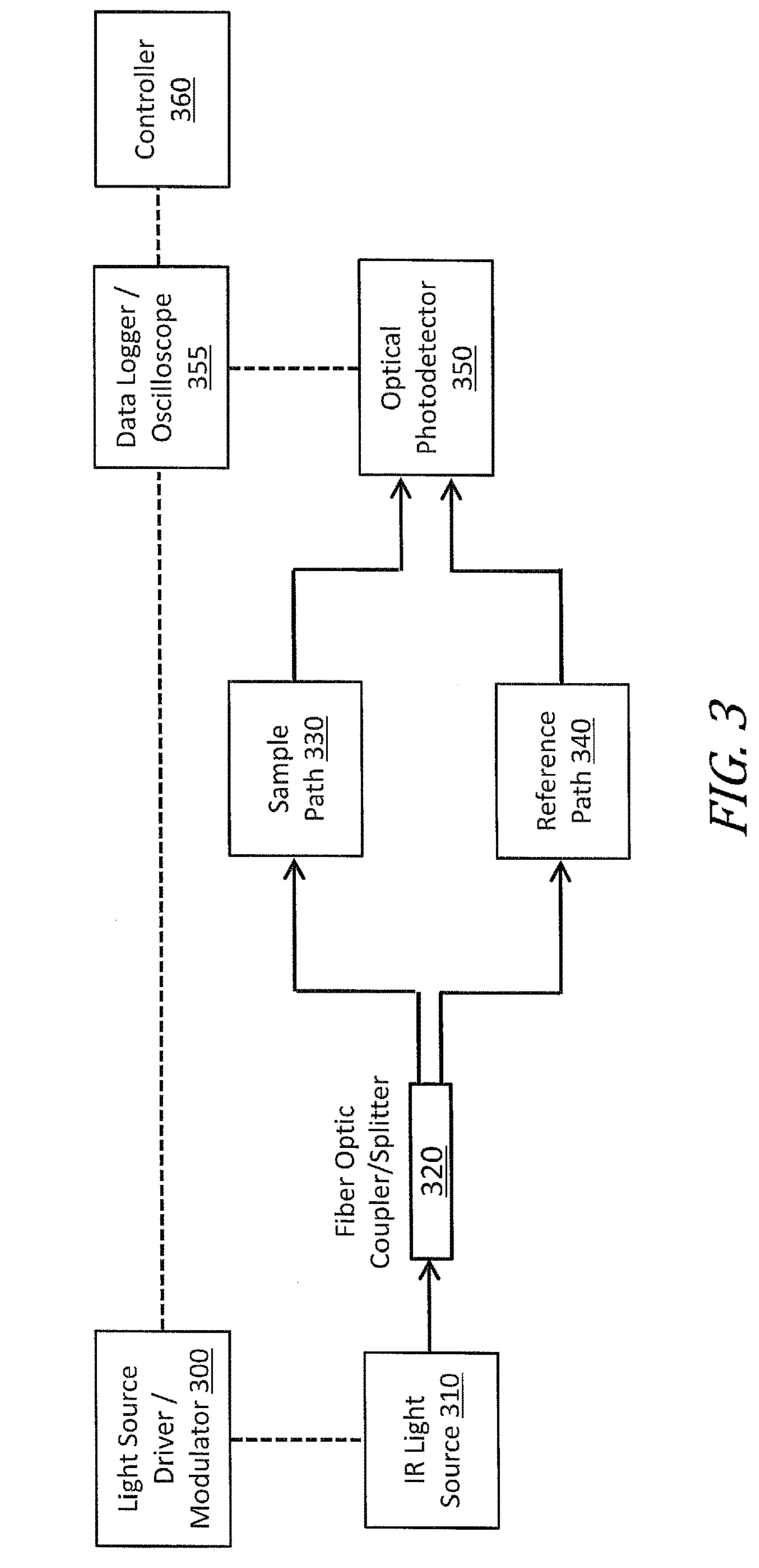
FIG. 3 is a block diagram illustrating one embodiment of an IR monitoring system in accordance with the present disclosure.

The controller 260 shown in FIG. 2 and the controller 360 shown in FIG. 3 can each be implemented in a wide variety of manners. In one example, the controller 260 and/or the controller 360 may be a computer. In another example, the controller 260 and/or the controller 360 may include one or more programmable integrated circuits that are programmed to provide the functionality described herein. For example, one or more processors (e.g., microprocessor, microcontroller, central processing unit, etc.), programmable logic devices (e.g., complex programmable logic device (CPLD), field programmable gate array (FPGA), etc.), and/or other programmable integrated circuits can be programmed with software or other programming instructions to implement the functionality of the controller(s) described herein. It is further noted that the software or other programming instructions can be stored in one or more non-transitory computer-readable mediums (e.g., memory storage devices, flash memory, dynamic random access memory (DRAM), reprogrammable storage devices, hard drives, floppy disks, DVDs, CD-ROMs, etc.), and the software or other programming instructions when executed by the programmable integrated circuits can cause the programmable integrated circuits to perform the processes, functions, and/or capabilities described herein. Other variations could also be implemented.

The Infrared (IR) Monitoring System

FIG. 3 illustrates an IR monitoring system 248 in accordance with one embodiment of the present disclosure. As shown in FIG. 3, the IR monitoring system 248 includes a light source driver/modulator 300 for driving an infrared (IR) light source 310 to emit IR radiation, a fiber optic coupler and splitter 320 to divide the IR radiation emitted from the IR light source 310 into a sample path 330 and a reference path 340, and an optical photodetector 350 for detecting the IR radiation transmitted through the sample and reference paths and generating an output signal in response thereto. The IR monitoring system 248 further includes a data logger (or oscilloscope) 355 for data collection and a controller 360 for controlling the operation of the IR light source 310 (via control signals supplied to the light source driver/modulator 300) and analyzing the output signal generated by the optical photodetector 350.

The IR radiation transmitted through the sample path 330 is passed through a liquid being monitored (e.g., a processing liquid or a waste stream) to the optical photodetector 350. The IR radiation transmitted through the reference path 340 does not pass through the liquid being monitored. The optical photodetector 350 detects the IR radiation transmitted through the sample path 330 and the IR radiation transmitted through the reference path 340 and generates an output signal representing a difference there between. In some embodiments, the controller 360 may use the difference between the IR radiation detected within the sample and reference paths to determine the composition and/or concentration of process chemical(s) included within the liquid being monitored. For example, the controller 360 may analyze the output signal generated by the optical photodetector 350 to detect the IR radiation absorbed by the one or more process chemicals included within the liquid and determine, based on the detected IR radiation, functional groups included within each of the process chemical(s) and an absolute concentration of the process chemical(s). In such embodiments, the reference path 340 is used by the optical photodetector 350 to perform the difference calculations, and also to factor out instabilities in the IR light source 310. When the IR monitoring system 248 is used for process control rather than absolute concentration measurements, the reference path 340 may include different options, such as a pure liquid sample (golden reference), neutral density filter, or open light path.

In certain embodiments, the IR monitoring system 248 may utilize low-cost IR sensing hardware, which is practical for large-scale implementation in semiconductor HVM equipment. The basic concept shown in FIG. 3 provides a dual beam IR monitoring system 248 in which the incident light (IR radiation) is split into a sample and reference path. System cost is significantly reduced in the IR monitoring system 248 by using individual fiber-coupled light emitting diodes (LEDs), rather than a full spectrum light source, and a fiber-optic coupler and splitter 320 as opposed to a lens-based beam splitter.

The IR light source 310 may generally include one or more LEDs. In some cases, the IR light source 310 may include a single LED that emits IR radiation within a small subset of narrow-band emission wavelengths, which correspond to an IR absorption peak associated with a functional group within a particular process chemical. For example, the single LED may have an emission wavelength range that is sufficient for detecting water in liquid photoresist materials. In other embodiments, the IR light source 310 may include a plurality of LEDs having a plurality of narrow-band emission wavelengths, each corresponding to a different IR absorption peak associated with functional groups included within one or more process chemicals. When multiple LEDs are used, the extra wavelengths can be used to distinguish the concentration of multiple species within the process chemical(s). For example, the extra emission wavelengths provided by multiple LEDs can be used to distinguish the amount of water contamination vs. solvent concentration in liquid photoresist materials. In some embodiments, the optical photodetector 350 may include one or more photodiodes, which are configured to detect the IR radiation emitted by the one or more LEDs. The wavelength of IR radiation emitted by the LED(s) and detected by the photodiode(s) may generally depend on the process chemical(s) and/or by-products being monitored by the IR monitoring system 248.

In some embodiments, an amplified optical photodetector may be used to implement the optical photodetector 350 shown in FIG. 3 to increase the detection sensitivity and detect lower concentrations of process chemicals and contaminants. When an amplified optical photodetector is utilized, the IR light source 310 may be configured to illuminate the sample path 330 and the reference path 340 with oscillating intensity, and the amplified optical photodetector may be configured to process the oscillating signals (similar to a lock-in amplifier) to determine the difference there between.

Incorporating IR Sensing Hardware within a Wet Processing Tool

The IR monitoring system 248 disclosed herein can be used to monitor process chemicals used to process a substrate disposed within a wet processing tool and/or the various by-products produced during wet processing. As such, the IR sensing hardware (e.g., the IR light source 310, fiber optic coupler and splitter 320, sample path 330 and/or optical photodetector 350) of the IR monitoring system 248 may be incorporated within the wet processing tool at variety of different locations.

Figure 4A:
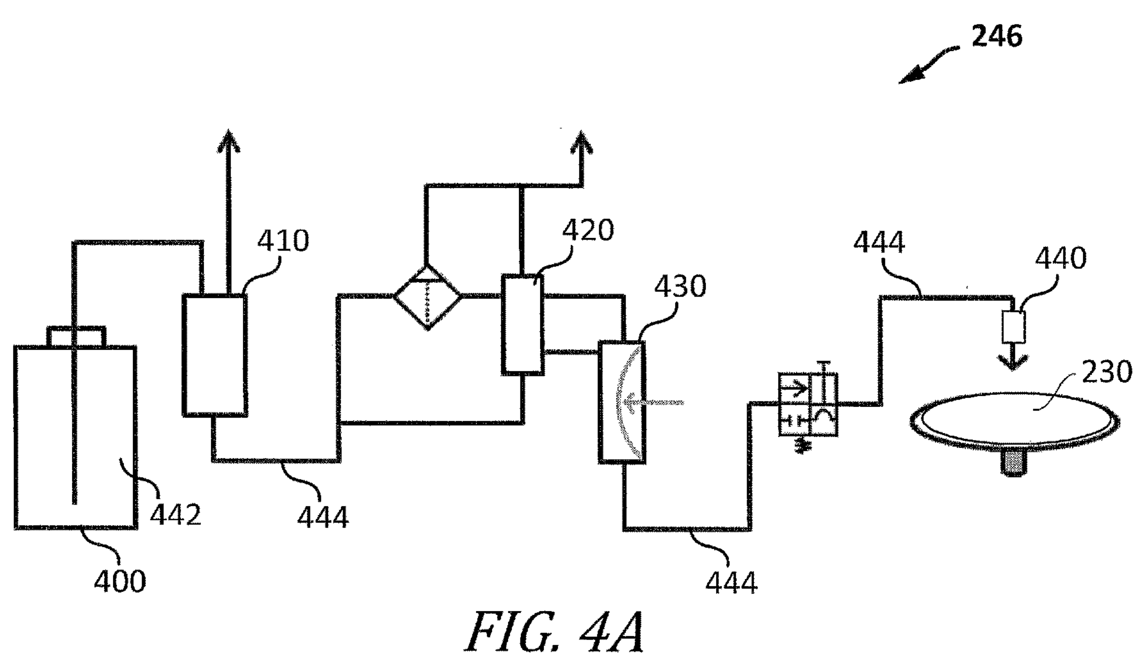
FIGS. 4A-4B are schematic diagrams illustrating various examples of chemical supply systems.
Figure 4B:
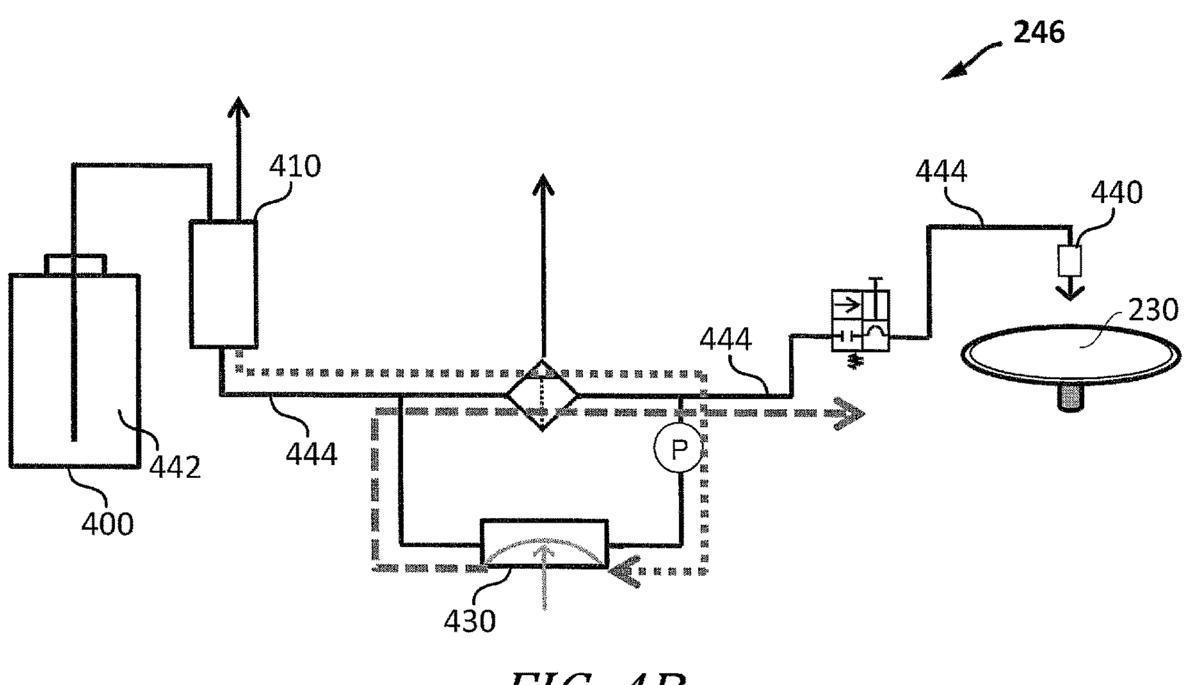

FIGS. 4A-4B illustrates various examples of chemical supply systems 246 that may be included within a wet processing tool. The chemical supply systems 246 shown in FIGS. 4A-4B include: (a) a resist bottle 400 and buffer tank 410 (e.g., reservoirs) for holding a processing liquid 442, (b) a liquid nozzle 440 coupled to dispense the processing liquid 442 onto the surface of a substrate 230, (c) a process line 444 coupled between the reservoirs and the liquid nozzle 440, (d) a pump 430 in fluid communication with the process line 444, and (e) a trap tank 420 in fluid communication with the process line 444. Although not shown in the figures, the chemical supply system may also include a drain or vent line, as is known in the art.

In some embodiments, IR sensing hardware of the IR monitoring system 248 may be coupled to one or more components of the chemical supply system 246 for monitoring the process chemical(s) dispensed onto the substrate surface during a wet process. For example, the IR light source 310 may be coupled to transmit IR radiation through at least one chemical supply system component, including but not limited to: the resist bottle 400, the buffer tank 410, the trap tank 420, the pump 430, the liquid nozzle 440, the process line 444 and the drain/vent line (not shown). In some embodiments, the at least one chemical supply system component may be at least partially transparent to IR radiation. For example, the at least one chemical supply system component may be formed of an IR transmissive material (e.g., an IR transmissive plastic, glass or quartz material), or may include a window that is transparent to IR radiation. In other embodiments, an IR transparent flow-cell may be coupled to the at least one chemical supply system component to provide an IR transmissive path through the component.

FIG. 5A illustrates an embodiment 500 of a process line 510 that is transparent to IR irradiation. The process line 510 shown in FIG. 5A can be formed from an IR transmissive plastic, glass or quartz material. For example, process line 510 may comprise polystyrene, polycarbonate, polymethyl methacrylate (PMMA), ultraviolet acrylic, polytetrafluoroethylene (PTFE), perfluoro alkoxy alkanes (PFA) and other materials transparent to IR radiation in the near, short-wave and mid-wave IR range. In the embodiment 500, the IR light source 310 transmits IR radiation through the process line 510, via a fiber optic line 520 coupled to the process line 510, to monitor the composition and/or concentration of the process liquid flowing through the process line 510.

FIG. 5B illustrates an embodiment 530 of an IR transparent flow-cell 540, which is incorporated within or coupled to a process line 550 that is not transparent to IR radiation. The IR transparent flow-cell 540 can be formed from an IR transmissive plastic, glass or quartz material. In some embodiments, the IR transparent flow-cell 540 may be formed from an IR transmissive plastic to reduce cost. For example, the IR transparent flow-cell 540 may comprise polystyrene, polycarbonate, polymethyl methacrylate (PMMA), ultraviolet acrylic and other plastic materials transparent to IR radiation in the near, short-wave and mid-wave IR range. Alternatively, the IR transparent flow-cell 540 may be formed from a quartz or chemical resistant glass. In the embodiment 530, the IR light source 310 transmits IR radiation through the IR transparent flow-cell 540, via a fiber optic line 520 coupled to the IR transparent flow-cell 540, to monitor the composition and/or concentration of the process liquid flowing through the process line 510.

FIG. 5C illustrates an embodiment 560 showing a plurality of process lines 510 incorporated into a nozzle holder 570, where each of the plurality of process lines 510 is formed from an IR transmissive plastic, glass or quartz material. In the embodiment 560, the IR light source 310 transmits IR radiation through the process lines 510, via a fiber optic line 520 coupled to the nozzle holder 570, to monitor the composition and/or concentration of a process liquid flowing through at least one of the process lines 510 before the process liquid is dispensed by a corresponding liquid nozzle 580. The process liquids (e.g., process liquids #1, #2 and #3) flowing through the plurality of process lines 510 may be the same or different. When different process liquids are provided, the IR light source 310 may transmit IR radiation through the plurality of process lines 510 one at a time to separately monitor the composition and/or concentration of the process liquid flowing through each process line 510. In order to facilitate separate monitoring of process liquids in the embodiment 560 shown in FIG. 5C, the process liquids (e.g., process liquids #1, #2 and #3) may be supplied to the plurality of process lines 510 one at a time, so that the IR radiation emitted by the IR light source 310 is transmitted through only one process liquid at a time.

Other embodiments not shown in FIGS. 5A-5C are further contemplated herein. In another embodiment, for example, the IR light source 310 and optical photodetector 350 may be perpendicular to and translatable across the plurality of process lines 510, so that the IR radiation emitted by the IR light source 310 is transmitted through the process lines 510 one at a time. In a further embodiment, the IR light source 310 and optical photodetector 350 may be perpendicular to the plurality of process lines 510 and positioned at a fixed location. In this embodiment, the plurality of process lines 510 may be configured to move, so that the multiple lines can be tested independently with a fixed optics setup.

As shown in FIGS. 3, 4A-4B and 5A-5C, the IR sensing hardware of the IR monitoring system 248 may be incorporated at various locations throughout the chemical supply system 246. The use of IR transmissive materials (e.g., IR transmissive plastic, glass or quartz materials) enables IR radiation from the IR light source 310 to be transmitted directly through a reservoir (such as the resist bottle 400 or buffer tank 410), a trap tank 420, a pump 430, a liquid nozzle 240/440/580, a process line 244/444/510 and/or a drain or vent line (not shown) of the chemical supply system 246. In some embodiments, a flow-cell 540 implemented with an IR transmissive plastic, quartz or glass may be incorporated within a process line 550 to monitor the process liquid flowing therethrough. The use of IR transmissive plastics within the chemical supply system component(s) and/or the flow-cell provides the advantage of reducing cost, while enabling process chemicals to be monitored in-line.

Monitoring Water Contamination in a Semiconductor Process

As noted above, water contamination is a known problem in metal oxide photoresist films and has been linked to various lithography processing defects (e.g., particle defects and inadequate CD uniformity). Metal oxide photoresist films include Sn-based metal oxide resists, as well as those based on other transition and post-transition metals including titanium (Ti), hafnium (Hf), aluminum (Al), gallium (Ga), indium (In), and antimony (Sb). In some embodiments, the IR monitoring techniques disclosed herein can be used to monitor and control water contamination in metal oxide photoresist films to reduce lithography processing defects and improve device performance and yield. Although various embodiments are discussed below in reference to metal oxide photoresist films, the IR monitoring techniques disclosed herein can be used to monitor any chemical, which is sensitive to water and dispensed by a wet processing tool.

Figure 6:
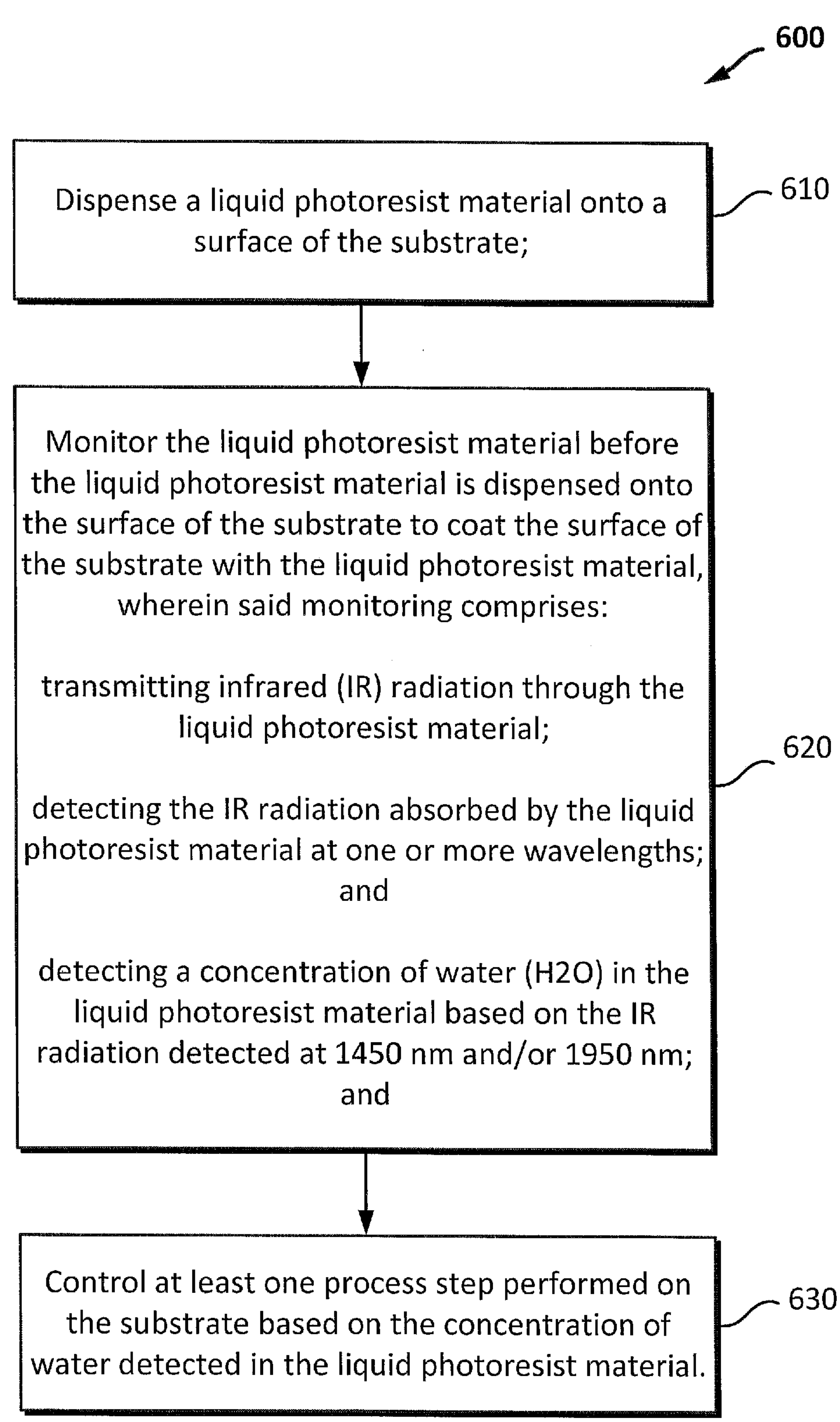
FIG. 6 is a flowchart diagram illustrating one embodiment of a method that utilizes the techniques described herein to monitor and control water contamination in a semiconductor process used to process a substrate.

FIG. 6 illustrates one embodiment of a method 600 that utilizes the techniques described herein to monitor and control water contamination in a semiconductor process used to process a substrate. The method 600 includes dispensing a liquid photoresist material onto a surface of the substrate (in step 610) and monitoring the liquid photoresist material before the liquid photoresist material is dispensed onto the surface of the substrate to coat the surface of the substrate with the liquid photoresist material (in step 620). During the monitoring step (step 620), the method 600: (a) transmits infrared (IR) radiation through the liquid photoresist material, (b) detects the IR radiation absorbed by the liquid photoresist material at one or more wavelengths, and (c) detects a concentration of water ($H_2O$) in the liquid photoresist material based on the IR radiation detected at 1450 nm and/or 1950 nm. In step 630, the method 600 controls at least one process step performed on the substrate based on the concentration of water detected in the liquid photoresist material in step 620. In doing so, the method 600 can be used to improve process control in the semiconductor process.

The method 600 can be used to monitor and control water contamination in photoresist films formed on a substrate. For example, the method 600 may be used to monitor and control water contamination in a metal oxide photoresist film. When the method 600 is used to monitor and control water contamination in a metal oxide photoresist film, the liquid photoresist material dispensed in step 610 may be an organometallic oxide containing a central metal atom of tin (Sn), zirconium (Zr), indium (In), antimony (Sb), gallium (Ga), bismuth (Bi), zinc (Zn), titanium (Ti), hafnium (Hf), aluminum (Al), or combinations thereof.

In some embodiments, the method 600 may control the concentration of water in the liquid photoresist material before the liquid photoresist material is dispensed onto the surface of the substrate to coat the surface of the substrate with the liquid photoresist material. For example, the method 600 may control an amount of water or solvent (or an amount of a water/solvent mixture) that is mixed with the liquid photoresist material before the liquid photoresist material is dispensed. In such embodiments, the method 600 may control the concentration of water in the liquid photoresist material in step 630 based on the concentration of water detected within the liquid photoresist material in step 620.

In other embodiments, the method 600 may control at least one operational parameter of one or more process steps, which are performed on the substrate after the liquid photoresist material is dispensed onto the surface of the substrate. For example, the method 600 may control: (a) an exposure time or dose used during an exposure step, which is performed on the substrate after the liquid photoresist material is dispensed onto the surface of the substrate, (b) a bake time or temperature used during a bake step, which is performed on the substrate before or after the exposure step, and/or (c) a develop time or developing solution concentration used during a developing step, which is performed on the substrate after the exposure step. In such embodiments, the method 600 may control the at least one operational parameter of the one or more process steps (in step 630) based on the concentration of water detected in the liquid photoresist material in step 620.

Metal oxide photoresist films are typically formed for use with extreme ultraviolet (EUV) lithography. As known in the art, EUV lithography includes a number of processing steps, including an exposure step, a developing step, optional heat-treating steps and other steps. An example EUV lithography process may typically begin by exposing the surface of a substrate containing an EUV-active photoresist film (e.g., a metal oxide photoresist film) to EUV irradiation at a wavelength of 13.5 nm in an EUV exposure step. The EUV lithography process may utilize a photomask to ensure that photo-induced reactions occur only in regions of the EUV-active photoresist exposed to the EUV irradiation. Regions of the EUV-active photoresist exposed to the EUV irradiation are converted to reacted photoresist, while regions of the EUV-active photoresist not exposed to the EUV irradiation remain unreacted. In some cases, an optional heat-treating step (for example, post-exposure bake (PEB)) may be performed after the EUV exposure step to stabilize the photoresist by completing the reactions initiated during exposure.

After the EUV exposure and optional post-exposure bake (PEB), a developing step may be performed to remove a portion of the EUV-active photoresist for patterning, thereby providing a patterned photoresist on the substrate surface. The developing step may be a wet or dry process. In some embodiments, a portion of the EUV-active photoresist may be removed by treating the substrate with a developing solution to dissolve the reacted (in case of a positive tone resist) or unreacted (in case of a negative tone resist) regions of the EUV-active photoresist. In other embodiments, a dry process (e.g., a selective plasma etch process, a thermal process or a gas phase develop process) may be used to remove the reacted or unreacted regions of the EUV-active photoresist.

Figures 7A, 7B:
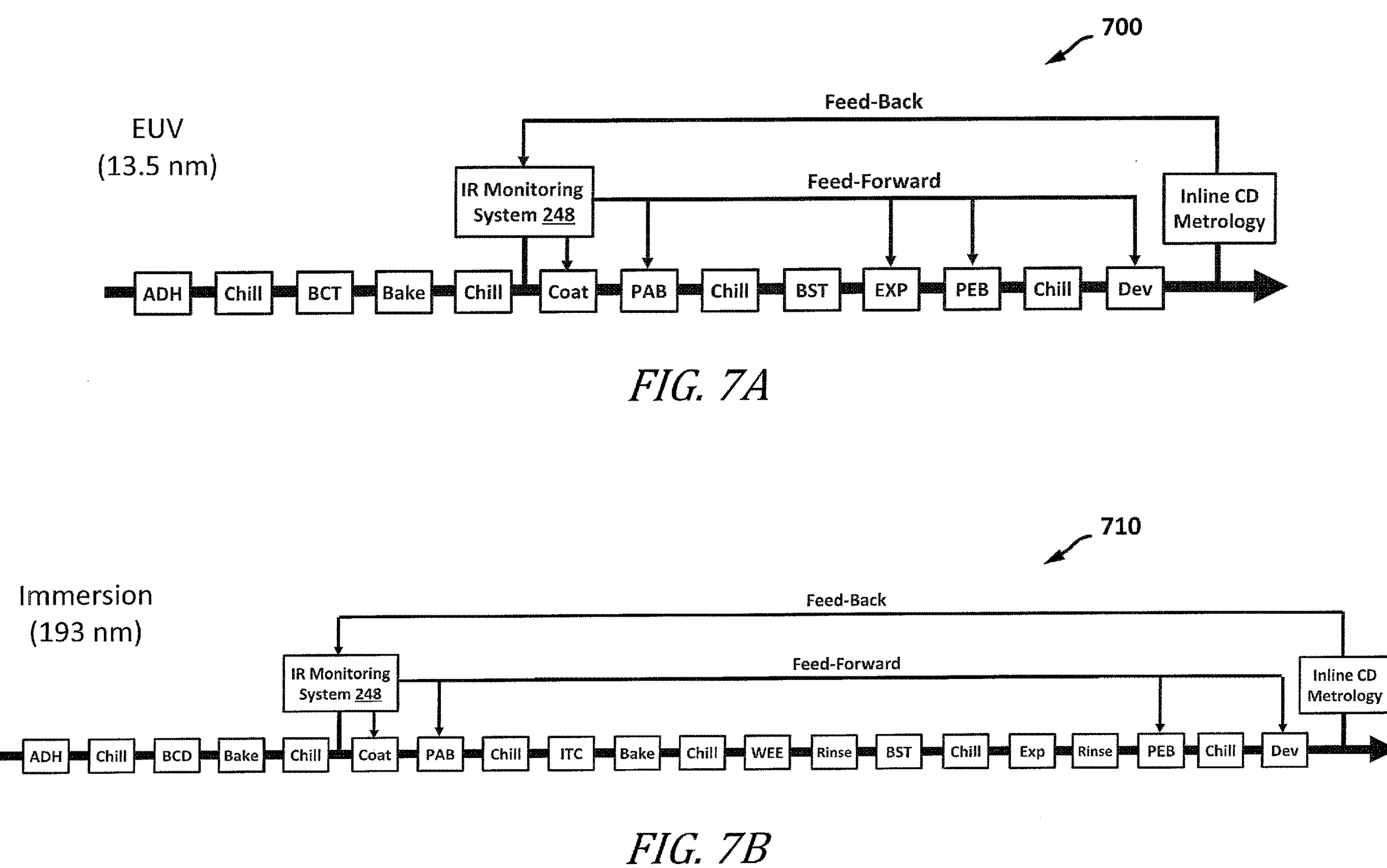
FIG. 7A is an example EUV (13.5 nm) process control loop that uses IR monitoring and feedforward control to control one or more process steps in the EUV process control loop.
FIG. 7B is an example immersion (193 nm) process control loop that uses IR monitoring and feedforward control to control one or more process steps in the immersion process control loop.

FIG. 7A illustrates one embodiment of an EUV (13.5 nm) process control loop 700 that uses IR monitoring and feed-forward control to monitor and control water contamination in EUV-active photoresists, such as metal oxide photoresists. As shown in FIG. 7A, the IR monitoring system 248 monitors the liquid photoresist material and detects the concentration of water ($H_2O$) in the liquid photoresist material (using, e.g., the method 600 shown in FIG. 6) before the liquid photoresist material is dispensed onto the surface of the substrate in the coating (Coat) step. The IR monitoring system 248 uses feed-forward control to control or adjust one or more subsequent process steps based on the IR monitoring results. For example, the IR monitoring system 248 may adjust a bake time or temperature used in the post application bake (PAB) or post exposure bake (PEB) step, the exposure time or dose used in the exposure (EXP) step or the develop time or developing solution concentration used during the developing (DEV) step, as shown in FIG. 7A.

Experiments have shown that parts-per-million (ppm) level concentrations of water can be detected in metal oxide photoresists by monitoring the absorption of 1450 nm IR light. This approach can also be applied to other chemicals that are sensitive to water and dispensed by wet processing tools. In some cases, similar monitoring methods can be used to monitor carbon dioxide ($CO_2$) levels in metal oxide photoresists.

Monitoring Concentrations of Process Chemicals and Chemical Mixtures Used in a Semiconductor Process In some embodiments, the IR monitoring techniques disclosed herein can be used to monitor and control mixing of process chemicals included within a chemical solution before the solution is dispensed onto the substrate. Many different process chemicals and chemical solutions dispensed in the wet processing tools can be detected using IR light. Examples of chemical solutions include, but are not limited to, mixtures of water or solvent with liquid photoresist materials, mixtures of sulfuric acid ($H_2SO_4$) and hydrogen peroxide ($H_2O_2$) to produce Caro's acid, mixtures of 85 to 93% v/v phosphoric acid ($H_3PO_4$) in water ($H_2O$), and incremental additions of <0.5% v/v IPA in TMAH solutions. Other chemicals and chemical solutions dispensed by wet processing tools can also be detected using IR light. Process control can be improved by monitoring the composition and concentration of the process chemicals included within the chemical solution before the chemical solution is dispensed onto the substrate.

Figure 8:
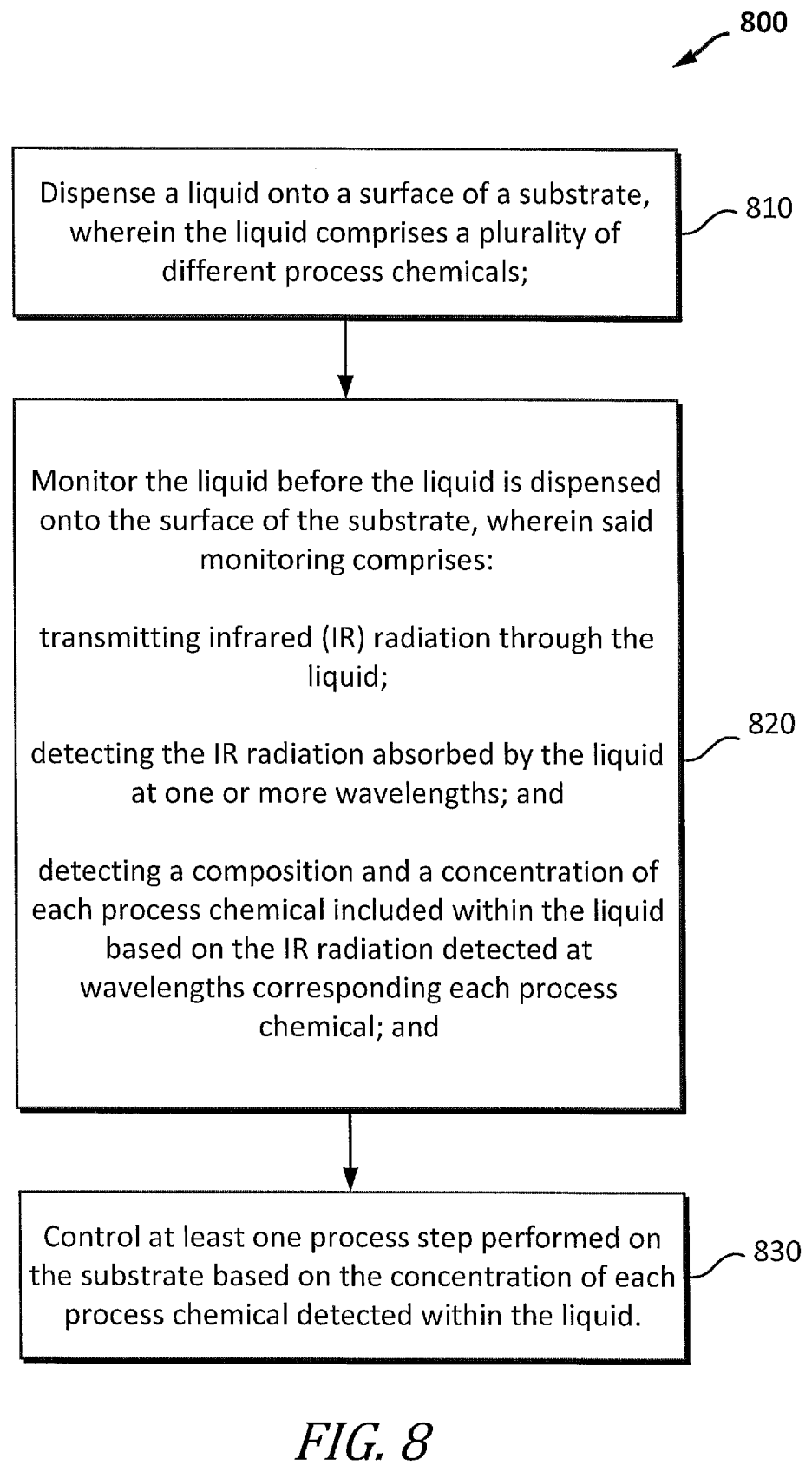

FIG. 8 is a flowchart diagram illustrating one embodiment of a method 800 that utilizes the techniques described herein to control a semiconductor process based on a concentration of process chemicals used in the semiconductor process. The method 800 includes dispensing a liquid onto a surface of a substrate, wherein the liquid comprises a plurality of process chemicals (in step 810) and monitoring the liquid before the liquid is dispensed onto the surface of the substrate (in step 820). During the monitoring step (step 820), the method 800 includes: (a) transmitting infrared (IR) radiation through the liquid, (b) detecting the IR radiation absorbed by the liquid at one or more wavelengths, and (c) detecting a composition and a concentration of each process chemical included within the liquid based on the IR radiation detected at wavelengths corresponding each process chemical. In step 830, the method 800 controls at least one process step performed on the substrate based on the concentration of each process chemical detected within the liquid in step 820.

In some embodiments, the method 800 may control the at least one process step performed on the substrate (in step 830) by controlling mixing of the plurality of process chemicals before the liquid is dispensed onto the surface of the substrate. For example, the liquid dispensed onto the surface of the substrate (in step 810) may include a plurality of process chemicals, which are mixed together within a coating solution, a developing solution, an etching solution or a cleaning solution. The method 800 detects a composition and a concentration of each process chemical included within the solution based on the IR radiation detected at wavelengths corresponding each process chemical (in step 820), and controls mixing of the plurality of process chemicals, based on the detected composition and concentration of each process chemical, before the solution is dispensed onto the surface of the substrate (in step 830). The method 800 may control mixing of a wide variety of process chemicals, which are used in a wide variety of processes to process a substrate.

In some embodiments, the method 800 may control mixing of process chemicals provided within a coating solution. For example, the method 800 may control an amount of water or solvent (or an amount of a water/solvent mixture) that is mixed with a liquid photoresist material before the liquid photoresist material is dispensed onto the surface of the substrate to coat the surface of the substrate with the photoresist material. The method 800 may control the amount of water or solvent mixed with the liquid photoresist material (in step 830) based on the concentration of water or solvent that is detected within the liquid photoresist material (in step 820). For example, the concentration of water in the liquid photoresist material can be detected (in step 820) based IR absorption peak(s) detected at 1450 nm (due to O—H bond stretching) and/or 1950 nm (due to the combination of O—H bond stretch and bend). When other solvent(s) are mixed with the liquid photoresist material, the concentration of the solvent(s) can be detected (in step 820) based on IR absorption peak(s) detected at other wavelengths (such as, for example, 1200 nm for various organic solvents, such as propylene glycol methyl ether acetate (PGMEA), propylene glycol ethyl ether (PGEE), cyclohexanone and 4-methyl-2-pentanol (MIBC), or 1187 nm for IPA).

In another example, the method 800 may control mixing of process chemicals provided within a developing solution, an etching solution or a cleaning solution. For example, the method 800 may control the amount of sulfuric acid ($H_2SO_4$) that is mixed with hydrogen peroxide ($H_2O_2$) to produce peroxymonosulfuric acid ($H_2SO_5$, otherwise known as Caro's acid). The method 800 may control relative amounts of $H_2SO_4$ mixed with $H_2O_2$ to form Caro's acid (in step 830) based on a concentration of $H_2SO_4$ and a concentration of $H_2O_2$ detected within the Caro's acid mixture (in step 820). The concentration of $H_2SO_4$ in the Caro's acid mixture can be detected (in step 820) based on IR absorption peak(s) detected between approximately 1150-1250 nm. Likewise, the concentration of $H_2O_2$ in the Caro's acid mixture can be detected (in step 820) based on IR absorption peak(s) detected between approximately 1350-1450 nm and 1650 nm.

In another example, the method 800 may control an amount of phosphoric acid ($H_3PO_4$) that is mixed with an amount of water ($H_2O$) to produce an aqueous phosphoric acid solution. The method 800 may control the relative amounts of $H_3PO_4$ mixed with $H_2O$ (in step 830) based on a concentration of $H_3PO_4$ and a concentration of $H_2O$ detected within the aqueous phosphoric acid solution (in step 820). The concentration of $H_3PO_4$ in the aqueous phosphoric acid solution can be detected (in step 820) based on IR absorption peak(s) detected between approximately 1149 and 1266 nm. Likewise, the concentration of $H_2O$ in the aqueous phosphoric acid solution can be detected (in step 820) based on IR absorption peak(s) detected at 1450 nm and/or 1950 nm.

In yet another example, the method 800 may control an amount of isopropyl alcohol (IPA, $C_3H_8O$) that is mixed with an amount of tetramethyl ammonium hydroxide (TMAH, $C_4H_{13}NO$) to produce a TMAH solution. The method 800 may control the relative amounts of IPA and TMAH (in step 830) based on a concentration of IPA and a concentration of TMAH detected within the TMAH solution (in step 820). The concentration of IPA in the TMAH solution can be detected (in step 820) based on IR absorption peak(s) detected at 2850-3100 nm (due to O—H bond stretching), 3450 nm (due to C—H bond stretching) and 7400-9700 nm (due to C—O bond stretching). Likewise, the concentration of TMAH in the TMAH solution can be detected (in step 820) based on IR absorption peak(s) detected at 1200 nm, 1450-1550 nm and 1900-2100 nm.

In other embodiments, the method 800 may control the at least one process step performed on the substrate (in step 830) by controlling at least one operational parameter of one or more process steps, which are performed on the substrate after the liquid is dispensed onto the surface of the substrate to coat the surface of the substrate with the liquid. For example, the method 800 may control the at least one process step performed on the substrate (in step 830) by controlling at least one of: (a) an exposure time or dose used during an exposure step, which is performed on the substrate after the liquid is dispensed onto the surface of the substrate to coat the surface of the substrate with the liquid; (b) a bake time or temperature used during a bake step, which is performed on the substrate before or after the exposure step; and (c) a develop time or developing solution concentration used during a developing step, which is performed on the substrate after the exposure step. In such embodiments, the method 800 may control the at least one operational parameter of the one or more process steps (in step 830) based on the concentration of concentration of each process chemical detected in the liquid in step 820.

The concentration of process chemicals dispensed in wet processing tools can have strong correlations to semiconductor device properties (such as film thicknesses and CD uniformity), which are measured later in the process. Once a correlation is verified and quantified, IR monitoring allows for immediate process control during the dispense step as well as fault detection. The IR monitoring signal can also be used for feed-forward control of subsequent process steps that impact film thickness and CD, such as post-apply bake (PAB), post-exposure bake (PEB), and development (Dev) for EUV, Immersion, I-line and KrF/ArF process flows. In this case, PAB and PEB operating parameters (e.g., bake time, temperature and/or environment) or DEV operating parameters (e.g., TMAH concentration and/or develop time) can be adjusted based on the IR monitoring signal to keep film thickness and CD on target.

Figures 7C, 7D:
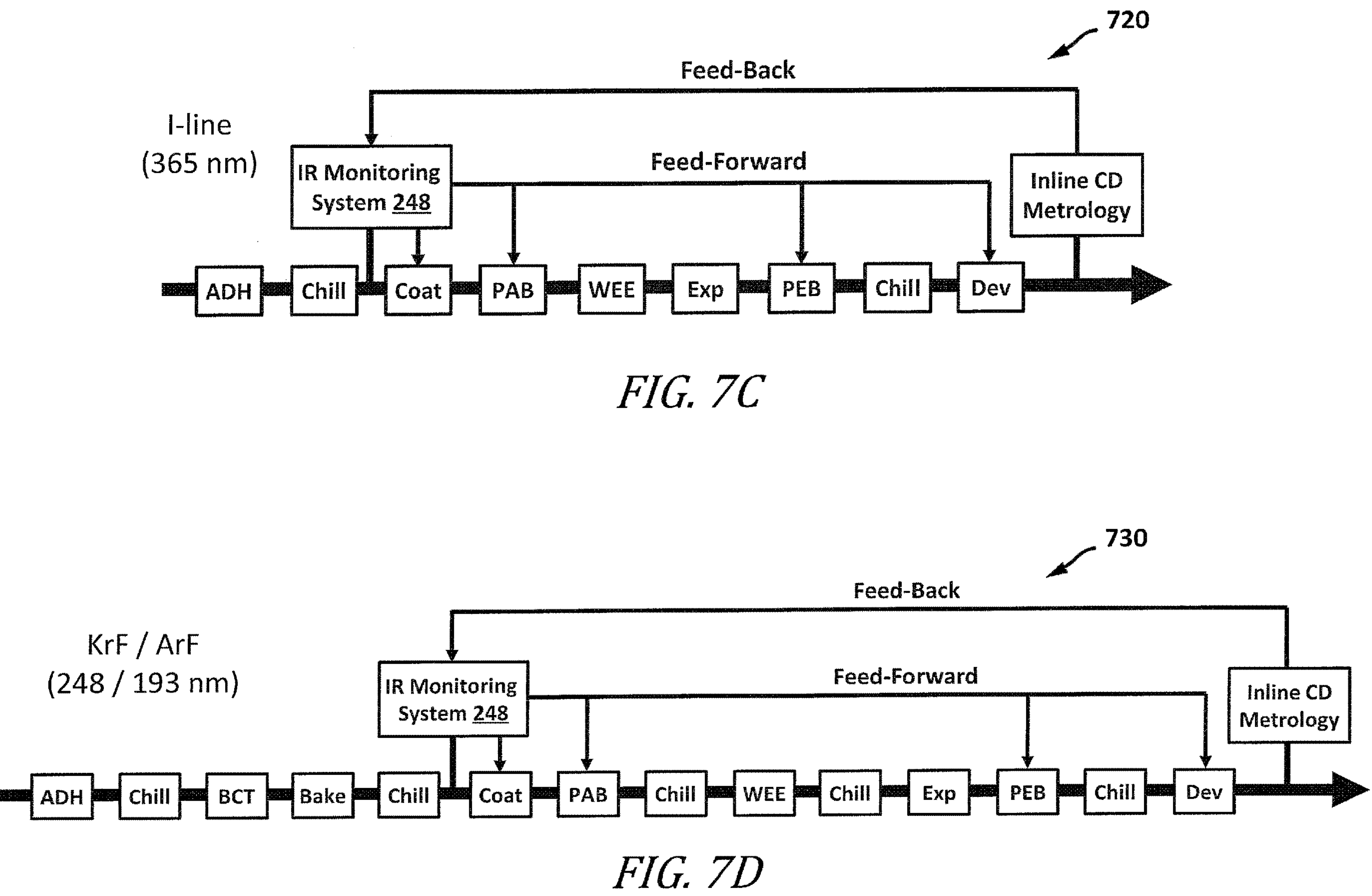
FIG. 7C is an example I-line (365 nm) process control loop that uses IR monitoring and feedforward control to control one or more process steps in the I-line process control loop.
FIG. 7D is an example KrF/ArF (248/193 nm) process control loop that uses IR monitoring and feedforward control to control one or more process steps in the KrF/ArF process control loop.

An example feed-back and feed-forward process control loop 700 for EUV is illustrated in FIG. 7A and described above. FIGS. 7B-7D provide additional examples of feed-back and feed-forward process control loops 710, 720 and 730 for immersion (193 nm), I-line (365 nm) and KrF/ArF (248/193 nm) processes, respectively. As shown in FIGS. 7A-7D, inline CD metrology measurements may be fed back to the IR monitoring system 248 to allow for immediate process control during the coating step, feed-forward process control of subsequent processing steps (e.g., PAB/PEB, EXP and/or DEV steps) and fault detection. For metal oxide photoresists formed using EUV lithography, the IR monitoring signal provided by the IR monitoring system 248 can be used for controlled incorporation or removal of water (e.g. inline mixing of water or adjusting the humidity inside the coating tool) or feed-forward to the stepper tool used for the exposure (EXP) step. On some wet processing tools, IR monitoring can also be used to better control concentrations in mixing lines and baths, as well as end-point detection.

Monitoring Process Chemicals for End-Point Detection

In some wet processing tools (sometimes referred to as cleaning tools or surface preparation tools), various solutions may be dispensed onto the surface of a substrate to etch a material layer formed on the substrate surface or remove residues from the surface of the substrate. Examples of such solutions include APM (ammonia/peroxide) solutions used in Standard Clean 1 (SC1) processes to remove organic matter and particles, HPM (hydrochloric/peroxide) solutions used in Standard Clean 2 (SC2) processes to remove metallic ions, TMAH solutions and phosphoric acid solutions. The solutions used in such tools may be used to etch/clean various layers on a substrate, including but not limited to, silicon and germanium containing films. The cleaning process can produce various by-products (such as hydroxylated silica and germania species) in the waste stream. By monitoring the concentration of the by-products in the waste stream, the IR monitoring techniques disclosed herein can be used to detect an end-point of the cleaning/etching process.

FIG. 9 is a flowchart diagram illustrating one embodiment of a method 900 that utilizes the techniques described herein to detect an end-point of a process used to process a substrate. The method 900 shown in FIG. 9 begins by processing the substrate by dispensing a liquid onto a surface of the substrate (in step 910). The liquid dispensed onto the substrate (in step 910) chemically reacts with the surface of the substrate to etch a material layer formed on the surface of the substrate or remove residues from the surface of the substrate. The method 900 further includes monitoring a waste stream removed from the surface of the substrate during said processing (in step 920). The waste stream includes the liquid dispensed onto the surface of the substrate and any by-products produced by etching the layer or removing the residues. During the monitoring step (step 920), the method 900: (a) transmits infrared (IR) radiation through the waste stream, (b) detects the IR radiation absorbed by the waste stream at one or more wavelengths, and (c) detects a composition and a concentration of the by-products in the waste stream based on the IR radiation detected at the one or more wavelengths. The method 900 further includes detecting an end-point of said processing based on the composition or the concentration of the by-products detected within the waste stream (in step 930). In some embodiments, the method 900 may terminate processing upon detecting the end-point of said processing (in step 930).

The method 900 shown in FIG. 9 may be used to detect the end-point of a wide variety of semiconductor processes. In some embodiments, a cleaning or etching solution (such as, e.g., an APM solution, HPM solution, TMAH solution or phosphoric acid solution) may be dispensed onto the surface of the substrate (in step 910) to etch a material layer formed on the surface of the substrate or remove residues from the substrate surface. In such embodiments, the method 900 may detect an end-point of the process based on the composition or the concentration of the by-products detected within the waste stream (in step 930). The by-products detected within the waste stream may depend on a variety of factors, such as the layer(s) being etched, the residues being removed and the chemical composition of the cleaning/etching solution. Although shown and described in the context of cleaning/etching a substrate surface, one skilled in the art would recognize how the IR monitoring techniques used in method 900 may alternatively be used to detect the end-point of other semiconductor processes. For example, the method 900 may alternatively be used to monitor the state of ligand fraction removal/hydrolyzation of an organometallic oxide photoresist and to detect and end-point or control a subsequent process step based of said monitoring.

The semiconductor processing system and method embodiments disclosed herein utilize IR spectroscopy to monitor the composition and/or concentration of process chemicals utilized to process a substrate and/or the by-products produced during substrate processing. By monitoring the process chemicals and/or the by-products in real-time, the systems and methods described herein can be used to provide better process control and/or provide end-point detection for a wide variety of semiconductor processes. In the examples provided above, IR spectroscopy is used to monitor the composition and/or concentration of process chemical(s) to be dispensed onto a substrate surface to provide better process control when forming metal oxide photoresist films on the substrate surface or when mixing the process chemicals to be dispensed onto the substrate surface. IR spectroscopy is also used in the examples provided above to provide end-point detection for various semiconductor processes. In addition to the examples provided above, one skilled in the art having the benefit of this disclosure may recognize other uses for the IR monitoring techniques disclosed herein.

The IR monitoring techniques disclosed herein can be used during the processing of a wide range of substrates. The substrate may be any substrate for which the patterning of the substrate is desirable. For example, in one embodiment, the substrate may be a semiconductor substrate having one or more semiconductor processing layers (all of which together may comprise the substrate) formed thereon. Thus, in one embodiment, the substrate may be a semiconductor substrate that has been subject to multiple semiconductor processing steps which yield a wide variety of structures and layers, all of which are known in the substrate processing art, and which may be considered to be part of the substrate. For example, in one embodiment, the substrate may be a semiconductor wafer having one or more semiconductor processing layers formed thereon. The concepts disclosed herein may be utilized at any stage of the substrate process flow, for example any of the numerous photolithography steps which may be utilized to form a completed substrate.

Thus, the term "substrate" as used herein means and includes a base material or construction upon which materials are formed. It will be appreciated that the substrate may include a single material, a plurality of layers of different materials, a layer or layers having regions of different materials or different structures in them, etc. These materials may include semiconductors, insulators, conductors, or combinations thereof. For example, the substrate may be a semiconductor substrate, a base semiconductor layer on a supporting structure, a metal electrode or a semiconductor substrate having one or more layers, structures or regions formed thereon. The substrate may be a conventional silicon substrate or other bulk substrate comprising a layer of semi-conductive material. As used herein, the term "bulk substrate" means and includes not only silicon wafers, but also silicon-on-insulator ("SOI") substrates, such as silicon-on-sapphire ("SOS") substrates and silicon-on-glass ("SOG") substrates, epitaxial layers of silicon on a base semiconductor foundation, and other semiconductor or optoelectronic materials, such as silicon-germanium, germanium, gallium arsenide, gallium nitride, and indium phosphide. The substrate may be doped or undoped.

The substrate may also include any material portion or structure of a device, particularly a semiconductor or other electronics device, and may, for example, be a base substrate structure, such as a semiconductor substrate or a layer on or overlying a base substrate structure. Thus, the term "substrate" is not intended to be limited to any particular base structure, underlying layer or overlying layer, patterned layer or unpatterned layer, but rather, is contemplated to include any such layer or base structure, and any combination of layers and/or base structures.

It is noted that reference throughout this specification to "one embodiment" or "an embodiment" means that a particular feature, structure, material, or characteristic described in connection with the embodiment is included in at least one embodiment of the invention, but do not denote that they are present in every embodiment. Thus, the appearances of the phrases "in one embodiment" or "in an embodiment" in various places throughout this specification are not necessarily referring to the same embodiment of the invention. Furthermore, the particular features, structures, materials, or characteristics may be combined in any suitable manner in one or more embodiments. Various additional layers and/or structures may be included and/or described features may be omitted in other embodiments.

One skilled in the relevant art will recognize that the various embodiments may be practiced without one or more of the specific details, or with other replacement and/or additional methods, materials, or components. In other instances, well-known structures, materials, or operations are not shown or described in detail to avoid obscuring aspects of various embodiments of the invention. Similarly, for purposes of explanation, specific numbers, materials, and configurations are set forth in order to provide a thorough understanding of the invention. Nevertheless, the invention may be practiced without specific details. Furthermore, it is understood that the various embodiments shown in the figures are illustrative representations and are not necessarily drawn to scale.

Further modifications and alternative embodiments of the methods described herein will be apparent to those skilled in the art in view of this description. It will be recognized, therefore, that the described methods are not limited by these example arrangements. It is to be understood that the forms of the methods herein shown and described are to be taken as example embodiments. Various changes may be made in the implementations. Thus, although the inventions are described herein with reference to specific embodiments, various modifications and changes can be made without departing from the scope of the present inventions. Accordingly, the specification and figures are to be regarded in an illustrative rather than a restrictive sense, and such modifications are intended to be included within the scope of the present inventions. Further, any benefits, advantages, or solutions to problems that are described herein with regard to specific embodiments are not intended to be construed as a critical, required, or essential feature or element of any or all the claims.

What is claimed is:

1. A method to control a semiconductor process, the method comprising:

dispensing a liquid onto a surface of a substrate, wherein the liquid comprises a plurality of different process chemicals;

monitoring the liquid before the liquid is dispensed onto the surface of the substrate, wherein said monitoring comprises:

transmitting infrared (IR) radiation through the liquid;

detecting the IR radiation absorbed by the liquid at one or more wavelengths; and detecting a composition and a concentration of each process chemical included within the liquid based on the IR radiation detected at wavelengths corresponding to each process chemical; and controlling at least one process step performed on the substrate based on the composition or the concentration of each process chemical detected within the liquid.

2. The method of claim 1, wherein said controlling the at least one process step performed on the substrate comprises controlling mixing of the plurality of different process chemicals before the liquid is dispensed onto the surface of the substrate, wherein said mixing is controlled based on the detected composition and concentration of each process chemical.

3. The method of claim 2, wherein said controlling mixing of the plurality of different process chemicals comprises:

controlling an amount of sulfuric acid ($H_2SO_4$) mixed with an amount of hydrogen peroxide ($H_2O_2$) to produce peroxymonosulfuric acid ($H_2SO_5$), wherein said controlling is based on a concentration of $H_2SO_4$ and a concentration of $H_2O_2$ detected within the liquid during said monitoring.

4. The method of claim 2, wherein said controlling mixing of the plurality of different process chemicals comprises:

controlling an amount of phosphoric acid ($H_3PO_4$) mixed with an amount of water ($H_2O$) to produce an aqueous phosphoric acid solution, wherein said controlling is based on a concentration of $H_3PO_4$ and a concentration of $H_2O$ detected within the liquid during said monitoring.

5. The method of claim 2, wherein said controlling mixing of the plurality of different process chemicals comprises:

controlling an amount of isopropyl alcohol (IPA) mixed with an amount of tetramethyl ammonium hydroxide (TMAH) to produce a TMAH solution, wherein said controlling is based on a concentration of IPA and a concentration of TMAH detected within the liquid during said monitoring.

6. The method of claim 2, wherein said controlling mixing of the plurality of different process chemicals comprises:

controlling an amount of water ($H_2O$) or solvent mixed with a photoresist material to produce the liquid, or controlling an amount of a water/solvent mixture that is mixed with the photoresist material to produce the liquid, before the liquid is dispensed onto the surface of the substrate to coat the surface of the substrate with the photoresist material, wherein said controlling is based on a concentration of water or solvent detected within the liquid during said monitoring.

7. The method of claim 1, wherein said controlling the at least one process step performed on the substrate comprises:

controlling at least one operational parameter of one or more process steps performed on the substrate after the liquid is dispensed onto the surface of the substrate to coat the surface of the substrate with the liquid.

8. The method of claim 7, wherein said controlling the at least one operational parameter of the one or more process steps comprises controlling at least one of:

an exposure time or dose used during an exposure step, which is performed on the substrate after the liquid is dispensed onto the surface of the substrate to coat the surface of the substrate with the liquid;

a bake time or temperature used during a bake step, which is performed on the substrate before or after the exposure step; and a develop time or developing solution concentration used during a developing step, which is performed on the substrate after the exposure step;

wherein the at least one operational parameter is controlled based on the concentration of each process chemical detected within the liquid during said monitoring.

9. A method to monitor process chemicals used in a semiconductor process, the method comprising:

dispensing a liquid onto a surface of a substrate, wherein the liquid dispensed onto the surface of the substrate comprises a liquid photoresist material;

monitoring the liquid before the liquid is dispensed onto the surface of the substrate, wherein said monitoring comprises:

transmitting infrared (IR) radiation through the liquid;

detecting the IR radiation absorbed by the liquid at one or more wavelengths; and detecting a composition and a concentration of at least one process chemical included within the liquid based on the IR radiation detected at the one or more wavelengths, wherein said detecting comprises detecting a concentration of water ($H_2O$) in the liquid photoresist material based on the IR radiation detected at 1450 nm and/or 1950 nm; and controlling at least one process step performed on the substrate based on the composition or the concentration of the at least one process chemical detected within the liquid.

10. The method of claim 9, wherein the liquid photoresist material comprises an organometallic oxide containing a central metal atom of tin (Sn), zirconium (Zr), indium (In), antimony (Sb), gallium (Ga), bismuth (Bi), zinc (Zn), titanium (Ti), hafnium (Hf), aluminum (Al), or combinations thereof.

11. The method of claim 10, wherein said controlling the at least one process step performed on the substrate comprises controlling at least one of:

the concentration of water in the liquid photoresist material before the liquid photoresist material is dispensed onto the surface of the substrate during a first process step to coat the surface of the substrate with the liquid photoresist material; and at least one operational parameter of one or more process steps performed on the substrate after the first process step;

wherein the concentration of water in the liquid photoresist material and the at least one operational parameter of the one or more process steps are controlled based on the concentration of water detected in the liquid photoresist material.

12. The method of claim 11, wherein said controlling the at least one operational parameter of the one or more process steps comprises controlling at least one of:

an exposure time or dose used during an exposure step, which is performed on the substrate after the liquid photoresist material is dispensed onto the surface of the substrate to coat the surface of the substrate with the liquid photoresist material;

a bake time or temperature used during a bake step, which is performed on the substrate before or after the exposure step; and a develop time or developing solution concentration used during a developing step, which is performed on the substrate after the exposure step.

13. The method of claim 9, wherein the liquid dispensed onto the surface of the substrate comprises a plurality of process chemicals, and wherein said monitoring the liquid comprises detecting a composition and a concentration of each process chemical included within the liquid based on the IR radiation detected at wavelengths corresponding to each process chemical.

14. The method of claim 13, wherein said controlling the at least one process step performed on the substrate comprises controlling mixing of the plurality of process chemicals before the liquid is dispensed onto the surface of the substrate, wherein said mixing is controlled based on the detected composition and concentration of each process chemical.

15. The method of claim 14, wherein said controlling mixing of the plurality of process chemicals comprises:

controlling relative amounts of the plurality of process chemicals mixed together to produce the liquid before the liquid is dispensed onto the surface of the substrate to coat the surface of the substrate with the liquid photoresist material.

16. The method of claim 15, wherein said controlling mixing of the plurality of process chemicals comprises:

controlling an amount of water ($H_2O$) or solvent mixed with a photoresist material to produce the liquid, or controlling an amount of a water/solvent mixture that is mixed with the photoresist material to produce the liquid, before the liquid is dispensed onto the surface of the substrate to coat the surface of the substrate with the photoresist material, wherein said controlling is based on a concentration of water or solvent detected within the liquid during said monitoring.

17. A method to monitor and control water contamination in a semiconductor process used to process a substrate, the method comprising:

dispensing a liquid photoresist material onto a surface of the substrate;

monitoring the liquid photoresist material before the liquid photoresist material is dispensed onto the surface of the substrate to coat the surface of the substrate with the liquid photoresist material, wherein said monitoring comprises:

transmitting infrared (IR) radiation through the liquid photoresist material;

detecting the IR radiation absorbed by the liquid photoresist material at one or more wavelengths; and detecting a concentration of water ($H_2O$) in the liquid photoresist material based on the IR radiation detected at 1450 nm and/or 1950 nm; and controlling at least one process step performed on the substrate based on the concentration of water detected in the liquid photoresist material.

18. The method of claim 17, wherein the liquid photoresist material comprises an organometallic oxide containing a central metal atom of tin (Sn), zirconium (Zr), indium (In), antimony (Sb), gallium (Ga), bismuth (Bi), zinc (Zn), titanium (Ti), hafnium (Hf), aluminum (Al), or combinations thereof.

19. The method of claim 18, wherein said controlling the at least one process step performed on the substrate comprises controlling at least one of:

the concentration of water in the liquid photoresist material before the liquid photoresist material is dispensed onto the surface of the substrate during a first process step to coat the surface of the substrate with the liquid photoresist material; and at least one operational parameter of one or more process steps performed on the substrate after the first process step.

20. The method of claim 19, wherein said controlling the concentration of water in the liquid photoresist material comprises:

controlling an amount of water ($H_2O$) or solvent that is mixed with the liquid photoresist material, or controlling an amount of a water/solvent mixture that is mixed with the liquid photoresist material, wherein said controlling is based on the concentration of water detected within the liquid photoresist material during said monitoring.

21. The method of claim 19, wherein said controlling the at least one operational parameter of the one or more process steps comprises controlling at least one of:

an exposure time or dose used during an exposure step, which is performed on the substrate after the liquid photoresist material is dispensed onto the surface of the substrate to coat the surface of the substrate with the liquid photoresist material;

a bake time or temperature used during a bake step, which is performed on the substrate before or after the exposure step; and a develop time or developing solution concentration used during a developing step, which is performed on the substrate after the exposure step;

wherein the at least one operational parameter is controlled based on the concentration of water detected in the liquid photoresist material during said monitoring.

* * * * *